United States Patent
Saito et al.

(10) Patent No.: US 8,604,473 B2
(45) Date of Patent: Dec. 10, 2013

(54) SEMICONDUCTOR DEVICE

(71) Applicant: Semiconductor Energy Laboratory Co., Ltd., Atsugi (JP)

(72) Inventors: Toshihiko Saito, Kanagawa (JP); Yuta Uemura, Kanagawa (JP)

(73) Assignee: Semiconductor Energy Laboratory Co., Ltd., Kanagawa-ken, Atsugi-shi (JP)

( * ) Notice: Subject to any disclaimer, the term of this patent is extended or adjusted under 35 U.S.C. 154(b) by 0 days.

(21) Appl. No.: 13/865,335

(22) Filed: Apr. 18, 2013

(65) Prior Publication Data

US 2013/0234133 A1    Sep. 12, 2013

Related U.S. Application Data

(63) Continuation of application No. 12/960,013, filed on Dec. 3, 2010, now Pat. No. 8,426,853.

(30) Foreign Application Priority Data

Dec. 4, 2009   (JP) .................................. 2009-276733

(51) Int. Cl.
  *H01L 29/12*    (2006.01)
  *H01L 29/786*   (2006.01)
  *H01L 21/336*   (2006.01)

(52) U.S. Cl.
  USPC .............. 257/43; 257/E29.296; 257/E21.411

(58) Field of Classification Search
  USPC ............... 257/43, E29.296, E21.411
  See application file for complete search history.

(56) References Cited

U.S. PATENT DOCUMENTS

| | | | |
|---|---|---|---|
| 5,731,856 | A  | 3/1998 | Kim et al. |
| 5,744,864 | A  | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |

(Continued)

FOREIGN PATENT DOCUMENTS

| | | |
|---|---|---|
| EP | 1737044 A1 | 12/2006 |
| EP | 2226847 A2 | 9/2010 |

(Continued)

OTHER PUBLICATIONS

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Luan C Thai
(74) *Attorney, Agent, or Firm* — Fish & Richardson P.C.

(57) ABSTRACT

An object is to provide a UV sensor with high accuracy, which can be manufactured at low cost and formed over a flexible substrate. A semiconductor device includes a transistor having an oxide semiconductor film, and a voltage source electrically connected to a gate of the transistor, in which a threshold voltage of the transistor is changed by irradiating the oxide semiconductor film with UV rays; a change in the threshold voltage of the transistor is dependent on a wavelength of the UV rays with which the oxide semiconductor film is irradiated, and the voltage source adjusts a voltage output to the gate of the transistor.

20 Claims, 16 Drawing Sheets

(56) References Cited

U.S. PATENT DOCUMENTS

| | | | |
|---|---|---|---|
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0072232 A1 | 3/2009 | Hayashi et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0184315 A1* | 7/2009 | Lee et al. | 257/43 |
| 2009/0278122 A1 | 11/2009 | Hosono et al. | |
| 2009/0280600 A1 | 11/2009 | Hosono et al. | |
| 2010/0053041 A1 | 3/2010 | Abe et al. | |
| 2010/0065844 A1 | 3/2010 | Tokunaga | |
| 2010/0092800 A1 | 4/2010 | Itagaki et al. | |
| 2010/0097838 A1 | 4/2010 | Tanaka et al. | |
| 2010/0109002 A1 | 5/2010 | Itagaki et al. | |
| 2010/0117072 A1 | 5/2010 | Ofuji et al. | |
| 2011/0049509 A1 | 3/2011 | Takahashi et al. | |
| 2011/0076790 A1 | 3/2011 | Ofuji et al. | |
| 2011/0101346 A1 | 5/2011 | Tateishi et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-043197 A | 2/1996 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-278487 A | 10/2006 |
| JP | 2007-066976 A | 3/2007 |
| JP | 2009-146100 A | 7/2009 |
| JP | 2009-182194 A | 8/2009 |
| WO | WO 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

(56) References Cited

OTHER PUBLICATIONS

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N. et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Asaoka, Y et al., "29.1: Polarizer-Free Reflective LCD Combined with Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho. D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al, Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at temperatures over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

(56) References Cited

OTHER PUBLICATIONS

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn-Oxide TFTs With a Novel Passivation Layer," SID Digest '09 : SID International Symposium Digest of Technical Papers, May 31, 2009, pp. 284-287.

\* cited by examiner

SEMICONDUCTOR DEVICE

CROSS-REFERENCE TO RELATED APPLICATIONS

This application is a continuation of U.S. application Ser. No. 12/960,013, filed Dec. 3, 2010, now allowed, which claims the benefit of a foreign priority application filed in Japan as Serial No. 2009-276733 on Dec. 4, 2009, both of which are incorporated by reference.

BACKGROUND OF THE INVENTION

1. Field of the Invention

One embodiment of the present invention relates to a semiconductor device including a UV sensor. One embodiment of the present invention also relates to an electronic device using the semiconductor device.

2. Description of the Related Art

In recent years, adverse effects of UV rays on human health have been widely known, and a demand for sensors which can detect UV rays at low cost and in a simple manner has been increased. As UV sensors, a MOS-type optical sensor element using a semiconductor layer including an oxide semiconductor (Patent Document 1), a sensor using a diamond semiconductor (Patent Document 2), a sensor using a single crystal semiconductor of ZnO (Patent Document 3), a sheet-like sensor which changes in color by being irradiated with UV rays (Patent Document 4), and the like are known.

REFERENCE

[Patent Document 1] Japanese Published Patent Application No. 2009-182194
[Patent Document 2] Japanese Published Patent Application No. 2007-066976
[Patent Document 3] Japanese Published Patent Application No. 2006-278487
[Patent Document 4] Japanese Published Patent Application No. H08-043197

In Patent Document 1, when light is received by a MOS-type element including an oxide semiconductor layer, the amount of received light is detected by utilizing a change in a drain current value with respect to a gate voltage. However, it is difficult to separate a wavelength which is absorbed because light in all of wavelength regions that is absorbed by the oxide semiconductor layer is detected as the amount of the received light.

Patent Document 2 proposes that a change in electric resistance of a material for a light receiving portion and a change in photoelectric current, which are generated by UV rays received by diamond be detected. However, because a diamond semiconductor is formed by epitaxial growth on a single crystal Si wafer having a (100) surface or a (111) surface, the cost might be increased. Further, because the single crystal Si wafer is used, it is difficult to form a UV sensor over a flexible substrate.

Patent Document 3 proposes a UV sensor which utilizes a change in resistance value of single crystal ZnO by irradiating the single crystal ZnO with UV rays. However, because ZnO is also a single crystal, there is a similar problem to Patent Document 1.

Patent Document 4 proposes a sheet-like UV sensor which changes in color by being irradiated with UV rays. Using this, a UV sensor can be provided over a flexible substrate. However, it is difficult for the sheet-like UV sensor to detect UV rays with high accuracy, and there is a problem in that the sheet-like UV sensor can not be used repeatedly in Patent Document 4.

SUMMARY OF THE INVENTION

In view of the above problems, it is an object of the present invention to provide a UV sensor with high accuracy, which can be formed over a flexible substrate at low cost. Further, it is an object of the present invention to simplify a manufacturing process for a semiconductor device by forming the UV sensor and a peripheral circuit over the same substrate.

The main point of one embodiment of the present invention is to use an oxide semiconductor (hereinafter also referred to as an OS) and to utilize properties of the OS for a UV sensor.

The transistor using an OS (hereinafter also referred to as OS-Tr) has a property of shifting a threshold value to a negative direction (negative shift) during irradiation of UV rays. Therefore, by adjusting voltage which is applied to a gate electrode so that an OS-Tr is turned off when irradiation of UV rays is not performed and the OS-Tr is turned on when irradiation of UV rays is performed, and monitoring output, a sensor for detecting the UV rays can be formed.

Further, an OS-Tr has a property of increasing leakage current (off-current) by irradiation of UV rays. Thus, a sensor for detecting UV rays can be formed by detecting difference of current in an off state.

Furthermore, an OS-Tr has a property in which changes in a negative shift of a threshold value and leakage current are different depending on a wavelength of UV rays with which the OS-Tr is irradiated. Specifically, the amount of negative shift and the amount of leakage current are remarkably increased by irradiation of UV-B (a wavelength of greater than or equal to 280 nm and less than 315 nm) or UV-C (a wavelength of greater than or equal to 200 nm and less than 280 nm), which are short wavelengths compared to irradiation of UV-A (a wavelength of greater than or equal to 315 nm and less than 380 nm), which is a long wavelength. Therefore, by adjusting voltage which is applied to a gate of the OS-Tr, a sensor for detecting a wavelength region included in UV rays can be formed.

Note that after the OS-Tr is irradiated with UV rays, the irradiation is not performed for a given length of time, whereby a threshold value of the OS-Tr, which is shifted, has a tendency to turn back and leakage current decreases; thus, the UV sensor can be used repeatedly.

In addition, as an oxide semiconductor film used for the OS-Tr, an amorphous oxide semiconductor film (including an amorphous oxide semiconductor film containing a microcrystal, a crystal grain, and the like) can be used. By using this, formation of a semiconductor film is easier than that of a semiconductor film formed using a single crystal; thus reduction in cost can be realized, and a UV sensor can be formed over a flexible substrate.

One embodiment of the present invention is a semiconductor device which includes a transistor including an oxide semiconductor film, and a voltage source electrically connected to a gate of the transistor, in which a threshold voltage of the transistor is changed by irradiating the oxide semiconductor film with UV rays; a change in the threshold voltage of the transistor is dependent on a wavelength of the UV rays with which the oxide semiconductor film is irradiated; and the voltage source adjusts a voltage output to the gate of the transistor.

One embodiment of the present invention is a semiconductor device which includes a transistor including an oxide semiconductor film, and a voltage source electrically connected to a gate of the transistor, in which off-current of the transistor is changed by irradiating the oxide semiconductor film with UV rays; a change in the off-current of the transistor is dependent on a wavelength of the UV rays with which the oxide semiconductor film is irradiated; and the voltage source adjusts a voltage output to the gate of the transistor.

One embodiment of the present invention is semiconductor device which includes a pixel portion having a first transistor including a first oxide semiconductor film; a sensor portion having a second transistor including a second oxide semiconductor film and a wiring electrically connected to a gate of the second transistor; and a voltage source electrically connected to the wiring, in which a threshold voltage of the second transistor is changed by irradiating the second oxide semiconductor film with UV rays; a change in the threshold voltage of the second transistor is dependent on a wavelength of the UV rays with which the second oxide semiconductor film is irradiated; and the voltage source adjusts a voltage output to the gate of the second transistor.

One embodiment of the present invention is a semiconductor device which includes a pixel portion having a first transistor including a first oxide semiconductor film; a sensor portion having a second transistor including a second oxide semiconductor film and a wiring electrically connected to a gate of the second transistor; and a voltage source electrically connected to the wiring, in which off-current of the second transistor is changed by irradiating the second oxide semiconductor film with UV rays; a change in the off-current of the second transistor is dependent on a wavelength of the UV rays with which the second oxide semiconductor film is irradiated; and the voltage source adjusts a voltage output to the gate of the second transistor.

According to one embodiment of the present invention, a UV sensor with high accuracy, which can be formed over a flexible substrate at low cost and used repeatedly, can be provided.

DETAILED DESCRIPTION OF THE INVENTION

Embodiments of the present invention will be described with reference to the drawings. Note that the invention is not limited to the following description, and it will be easily understood by those skilled in the art that various changes and modifications can be made without departing from the spirit and scope of the invention. Thus, the present invention should not be interpreted as being limited to the following description of the embodiments.

Embodiment 1

Figure 1A:
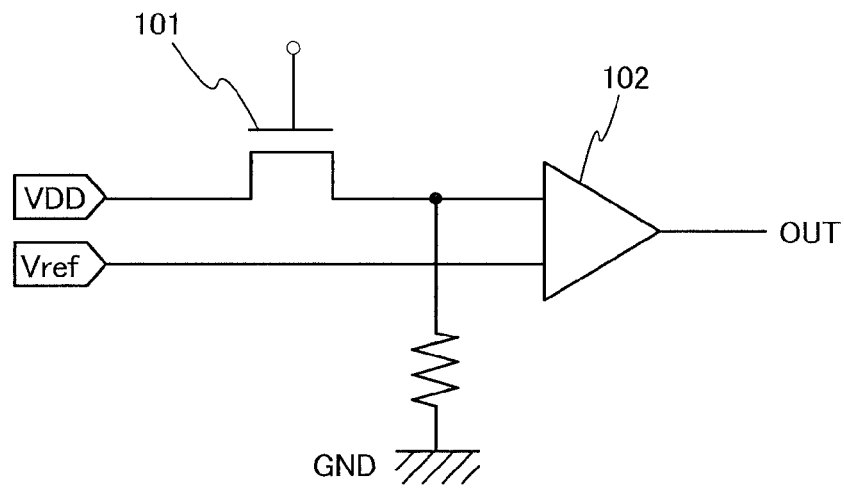
FIGS. 1A and 1B are equivalent circuit diagrams each illustrating a semiconductor device according to one embodiment of the present invention.
Figure 1B:
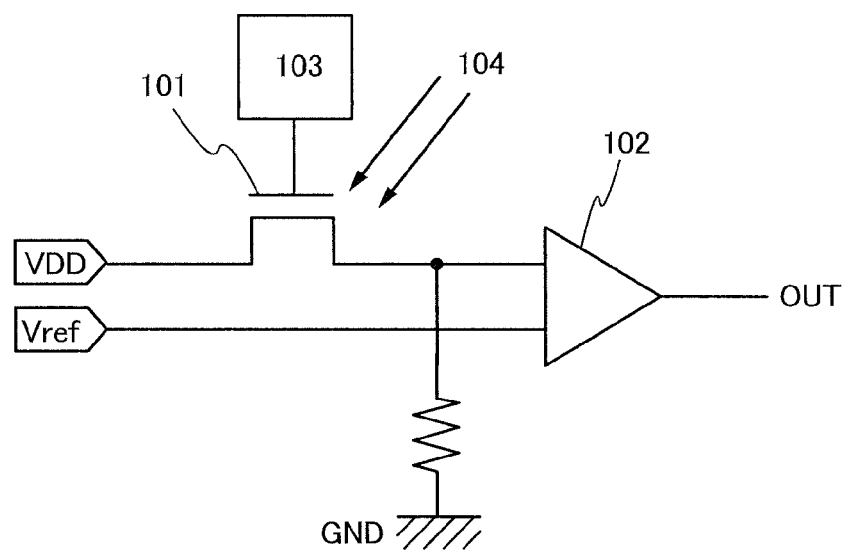

This embodiment will describe a basic circuit configuration of a UV sensor that is one embodiment of the present invention with reference to FIGS. 1A and 1B.

The UV sensor illustrated in FIG. 1A includes a transistor 101 and an amplifier circuit 102.

In this specification, the transistor includes at least a gate, a source, and a drain. Moreover, the transistor can have a top-gate structure or a bottom-gate structure, for example.

Note that a gate in this specification refers to the entire gate electrode and gate wiring or part thereof. The gate wiring is a wiring for electrically connecting a gate electrode of at least one transistor to a different electrode or a different wiring.

A source in this specification refers to the entire source electrode and source wiring or part thereof. The source electrode indicates part of a conductive layer, which is connected to the source region. The source wiring is a wiring for electrically connecting a source electrode of at least one transistor to a different electrode or a different wiring.

The drain is the entire drain electrode, and drain wiring or part thereof. The drain electrode indicates part of a conductive layer, which is connected to the drain region. The drain wiring is a wiring for electrically connecting a drain electrode of at least one transistor to a different electrode or a different wiring.

Further, in this specification, a source and a drain of a transistor may interchange depending on the structure, the operating condition, or the like of the transistor; therefore, it is difficult to define which is a source or a drain. Therefore, in this document (the specification, the claims, the drawings, and the like), one of them is referred to as one of the source and the drain, and the other is referred to as the other of the source and the drain.

In this specification, "being connected" is synonymous with "being electrically or physically connected".

In this specification, the amplifier circuit 102 has a first input terminal, a second input terminal, and an output terminal; however, the structure of the amplifier circuit of this invention is not limited thereto. The amplifier circuit 102 may have an additional input terminal and an additional output terminal, or any other structure can be applied as long as a similar operation can be performed.

One of the source and the drain of the transistor 101 is connected to a voltage source, and the other of the source and the drain is connected to the first input terminal of the amplifier circuit 102. In addition, the second input terminal of the amplifier circuit 102 is connected to a reference voltage source.

An oxide semiconductor film is used at least in a channel formation region of the transistor 101. In this embodiment, a semiconductor containing In, Ga, and Zn (abbrev. IGZO) is used as the oxide semiconductor film. However, the oxide semiconductor film used in this invention is not limited thereto; for example, an oxide semiconductor containing In, Al, and Zn (abbrev. IAZO), or an oxide semiconductor containing In, Si, and Zn can be used.

In this embodiment, an IGZO is used as the oxide semiconductor film, the transistor 101 has n-type conductivity; however, the transistor of this invention is not limited thereto, and may have i-type conductivity or p-type conductivity. Further, a carrier density changes in accordance with the concentration of oxygen and the like of the oxide semiconductor film. Note that the carrier density of the oxide semiconductor film is $5.0 \times 10^{14}/cm^3$ or lower, preferably $5.0 \times 10^{12}/cm^3$ or lower, much preferably $6.0 \times 10^{10}/cm^3$ or lower (or lower than $6.0 \times 10^{10}/cm^3$).

In this embodiment, the gate of the transistor 101 is held at a first potential that is a given negative potential. Thus, the transistor 101 is normally-off.

The threshold value of the transistor 101 shifts negatively when the oxide semiconductor film is irradiated with UV rays. That is, the transistor 101 can be used for a UV light receiving element in FIG. 1A.

By the irradiation of UV rays, when the threshold value of the transistor 101 shifts negatively more than the first potential, the transistor 101 is turned on (on-state) and the voltage source and the first input terminal of the amplifier circuit 102 are electrically connected. Here, on-state is defined as the state where a current value flowing through the transistor 101 is equal to or more than a certain value. In addition, off-state is defined as the state where the current value flowing through the transistor 101 is smaller than the certain value.

In this embodiment, as the amplifier circuit 102, an operational amplifier is used. In this case, when the transistor 101 is turned on, a VDD is input from the voltage source to an inverting input terminal that is the first input terminal, and Vref is input from the reference voltage source to a non-inverting input terminal that is the second input terminal. In addition, when the transistor 101 is turned off, GND is input to the non-inverting input terminal.

In this embodiment, each potential is set so as to be VDD>Vref>GND. Accordingly, when the transistor 101 is turned on, a positive potential which is amplified from the output terminal of the amplifier circuit 102 is output, and when the transistor 101 is turned off, a negative potential is output.

Accordingly, when the output of the amplifier circuit 102 has a positive potential, irradiation of UV rays on the transistor 101 can be detected.

Note that after the transistor 101 is irradiated with UV rays, irradiation is not performed for a given length of time, whereby a threshold value of the transistor 101, which is shifted negatively, turns back. This shows that a UV sensor of one embodiment of the present invention can be used repeatedly.

In this embodiment, the UV sensor including a transistor 101 and an amplifier circuit 102 is disclosed; however the UV sensor of this invention is not limited thereto, and may include more transistors and amplifiers. Therefore, improvement in UV sensitivity and improvement in reliability of the whole UV sensor can be realized. Further, by providing a plurality of transistors connected in parallel to each other and connecting them to one amplifier, a UV sensor can operate even if there is a defect in any one of the transistors.

Although not illustrated in the figure, in addition to the above-described structure, a buffer for reducing noise, a switch for an input or output terminal of the amplifier circuit 102, or the like can be used. Accordingly, in the case where a threshold value of the transistor shifts by a cause other than UV rays, occurrence of malfunction of the UV sensor can be prevented.

As described above, a UV sensor, whose circuit configuration is simple and which can be used repeatedly, can be provided.

This embodiment can be implemented combining with another embodiment as appropriate.

Embodiment 2

This embodiment will describe a UV sensor that is one embodiment of the present invention with reference to FIG. 1B.

In UV rays, specifically, those called near-UV radiation, there are UV-A (a wavelength of greater than or equal to 315 nm and less than 380 nm), UV-B (a wavelength of greater than or equal to 280 nm and less than 315 nm) or UV-C (a wavelength of greater than or equal to 200 nm and less than 280 nm). The UV-B or UV-C which is shorter wavelengths than UV-A has more energy and larger influence on the human body. Thus, it is much important to detect whether UV-B or UV-C which is shorter wavelength is included in UV rays.

In addition, the transistor 101 has a property in which the amount of change in a threshold value is different depending on a wavelength of UV rays with which the transistor 101 is irradiated. Specifically, the shorter the wavelength of the UV rays, the more pronounced the negative shift of the threshold value of the transistor 101 becomes. By utilizing this property, a UV sensor which can detect not only UV rays but also the range of wavelengths included in the UV rays in a simple manner with high accuracy is illustrated in FIG. 1B.

Note that as illustrated in FIG. 1B, a transistor and an amplifier circuit have the same structure as those of Embodiment 1; thus, portions similar to those in FIG. 1A are denoted by the same reference numerals and detailed description is omitted here.

In FIG. 1B, in addition to the circuit configuration illustrated in FIG. 1A, a variable voltage source 103 is connected to the gate of the transistor 101. Further, the reference numeral 104 represents UV rays with which the transistor 101 is irradiated.

There are no particular limitations on the variable voltage source 103 as long as is has a function of adjusting voltage output to the gate of the transistor 101. Thus, in this specification, the variable voltage source 103 includes a power circuit such as a voltage amplifier circuit.

There are no particular limitations on the UV rays 104 as long as UV rays are included, and for example, light including UV rays such as sunlight is included.

Further, it is preferable that a relationship between the wavelength of UV rays for irradiation and a threshold value which is shifted by the UV rays be recorded. Note that the second potential described below is a given potential that is lower than the first potential, and the third potential is a given potential that is higher than the first potential.

First, the case where the transistor 101 whose gate potential is set to the first potential is turned on when it is irradiated with UV rays 104 is examined.

During the irradiation of UV rays 104, the potential which is lower than the first potential is applied to the gate of the transistor 101 using the variable voltage source 103. It is assumed that the transistor 101 is turned off when a potential applied to the gate of the transistor 101 becomes the second potential. At this time, by detecting the second potential and comparing the relationship between the second potential and the wavelength of the UV rays, a wavelength region included in the UV rays 104 can be detected.

Next, the case where the transistor 101 whose gate potential is set to the first potential is turned off when it is irradiated with UV rays 104 is examined.

During the irradiation of the UV rays 104, the potential which is higher than the first potential is applied to the gate of the transistor 101 using the variable voltage source 103. It is assumed that the transistor 101 is turned on when a potential applied to the gate of the transistor 101 becomes the third potential. At this time, by detecting the third potential and comparing the relationship between the third potential and the wavelength of the UV rays, a wavelength region included in the UV rays 104 can be detected.

As described above, the gate potential of the transistor 101 is adjusted by the variable voltage source 103, whereby a short wavelength included in the UV rays 104 and a wavelength region can be detected with high accuracy.

In this embodiment, the variable voltage source 103 is disclosed; however the UV sensor of this invention is not limited thereto, and a plurality of transistors and a plurality of voltage sources each connected to a gate of the plurality of transistors and outputting different voltage may be included. Accordingly, when irradiation of UV rays is performed, transistors in the plurality of transistors, which are turned on can be distinguished, whereby the wavelength region included in the UV rays can be detected all at once.

This embodiment can be implemented combining with another embodiment as appropriate.

Embodiment 3

Figure 2A:
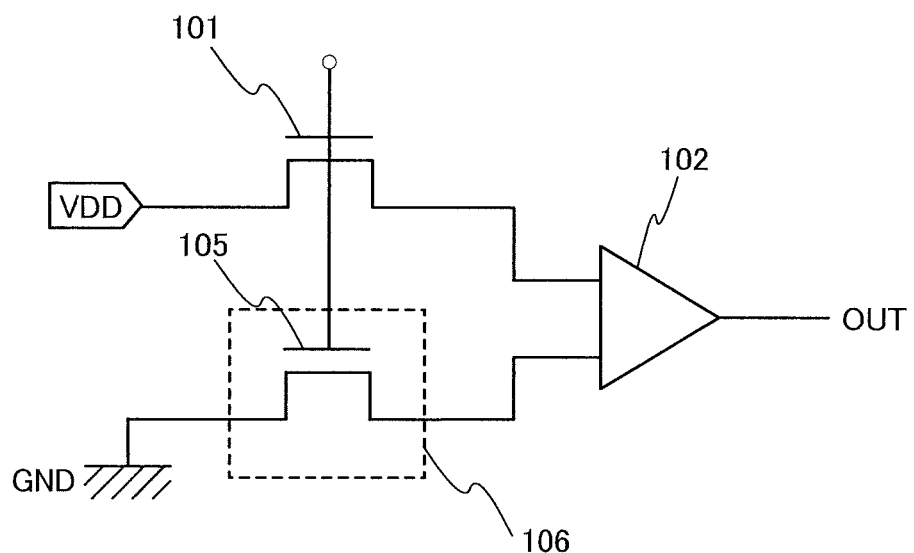
FIGS. 2A and 2B are equivalent circuit diagrams each illustrating a semiconductor device according to one embodiment of the present invention.
Figure 2B:
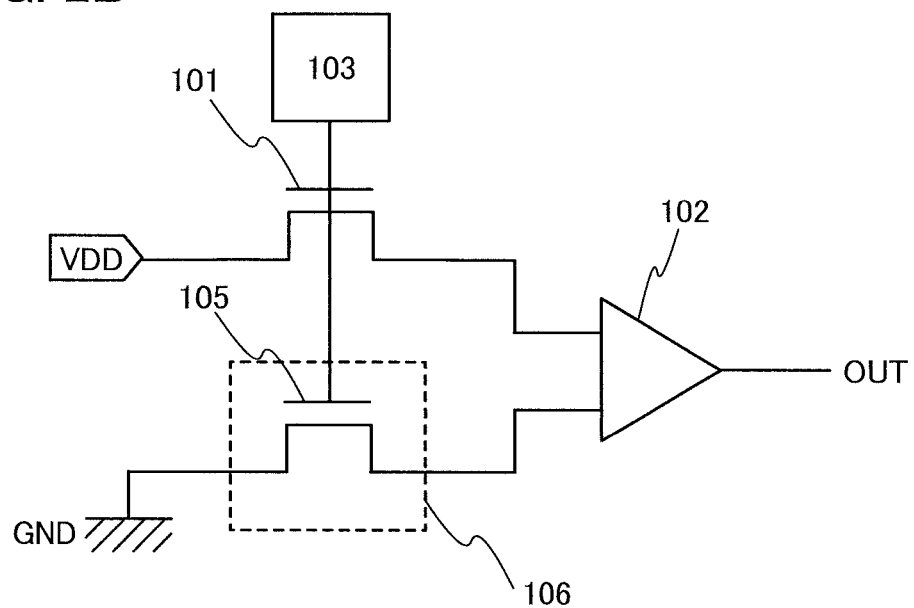

This embodiment will describe a UV sensor that is one embodiment of the present invention with reference to FIGS. 2A and 2B.

In FIGS. 2A and 2B, as for a structure of a transistor and an amplifier circuit, the same portions as those of FIGS. 1A and 1B in Embodiments 1 and 2 are denoted by the same reference numerals, and detailed description thereof is omitted here.

In FIG. 2A, in addition to the circuit configuration illustrated in FIG. 1A, a gate of the transistor 105 is connected to the gate of the transistor 101, and one of source and drain of the transistor 105 is connected to a GND and the other is connected to the second input terminal of the amplifier circuit 102.

In addition, a light shielding film 106 is formed to prevent the transistor 105 from being irradiated with UV rays. Thus, in this embodiment, the transistor 101 serves as a UV light receiving element.

The transistor 105 is formed so that the channel width thereof is longer than that of the transistor 101 or the channel length thereof is shorter than that of the transistor 101, or both of requirements are satisfied. Accordingly, when the UV light receiving element is not irradiated with UV rays, the transistor 105 which is shielded from light is preferentially turned on as compared to the transistor 101, and then a GND is output to the second input terminal of the amplifier circuit 102 and a negative potential is output from the output terminal.

When the UV light receiving element is irradiated with UV rays, the transistor 101 is turned on, and then a VDD is input to a first input terminal of the amplifier circuit and an amplified positive potential is output from the output terminal.

Further, as shown in FIG. 2B, the gate of the transistor 101 and the gate of the transistor 105 may be connected to the variable voltage source 103. Therefore, as in Embodiment 2, a plurality of wavelengths included in the UV rays can be detected with high accuracy.

The transistors 101 and 105 may be manufactured in the same process. Accordingly, simplification of the process can be realized.

The light shielding film 106 may be any film as long as it absorbs or reflects UV rays, for example, the light shielding film 106 can be formed using a film which blocks UV rays, a metal material which reflects UV rays and the like. In that case, visible light is not particularly considered because a pronounced shift of a threshold value as the UV rays is not generated when the transistor is irradiated with the visible light.

It is preferable that the light shielding film 106 be provided only in the direction irradiated with UV rays. For example, in the case where the substrate over which the transistor 105 is formed of a material which does not transmit UV rays, the light shielding film 106 is formed to cover the transistor 105. Furthermore, in the case where the transistor 101 is irradiated with UV rays through the substrate, the light shielding film 106 is formed between the substrate and the transistor 105.

All of transistors included in the amplifier circuit 102 and the variable voltage source 103 or part thereof may be manufactured in the same process as the transistors 101 and 105. Thus, reduction in cost by simplification of a process can be realized.

In that case, it is preferable to provide the light shielding film 106 also for the amplifier circuit 102 and the variable voltage source 103 because malfunction, accelerated deterioration, and the like due to the irradiation of UV rays can be prevented.

This embodiment can be implemented combining with another embodiment as appropriate.

Embodiment 4

Figure 3:
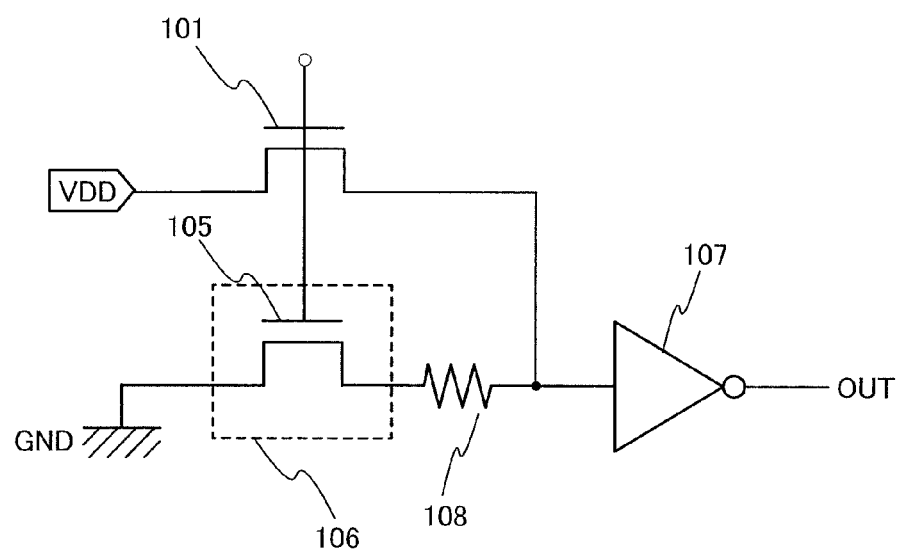
FIG. 3 is an equivalent circuit diagram illustrating a semiconductor device according to one embodiment of the present invention.

This embodiment will describe a UV sensor that is one embodiment of the present invention with reference to FIG. 3.

In FIG. 3, as for a structure of a transistor and the like, the same portions as those of FIGS. 1A and 2B in Embodiments 1 to 3 are denoted by the same reference numerals, and detailed description thereof is omitted here.

In FIG. 3, unlike the circuit configuration in FIG. 2A, an inverter 107 is provided instead of the amplifier circuit 102, and one of the source and the drain of the transistor 101 and one of the source and the drain of the transistor 105 are connected to an input terminal of the inverter 107 through a resistive element 108.

The light shielding film 106 is formed so that the transistor 105 is not irradiated with UV rays. Thus, in this embodiment, the transistor 101 serves as a UV light receiving element.

When the UV sensor is irradiated with UV rays, the transistor 101 is turned on, and then a VDD is input to the input terminal of the inverter 107 and a GND is output from the inverter 107.

At this time, the transistor 105 is formed so that the channel width thereof is longer than that of the transistor 101 or the channel length thereof is shorter than that of the transistor 101, or both of requirements are satisfied. Accordingly, when the UV sensor is not irradiated with UV rays, the transistor 105 which is shielded from light is preferentially turned on, and then the GND is output to the input terminal of the inverter 107.

Further, one of the source and the drain of the transistor 101 may be connected to the GND, and the other may be connected to the VDD of the source and the drain of the transistor 105. Accordingly, the VDD is output from the inverter 107 by the irradiation of UV rays.

By using the inverter as described above, a UV sensor in which power loss is smaller than the amplifier circuit can be provided.

This embodiment can be implemented combining with another embodiment as appropriate.

Embodiment 5

Figure 4:
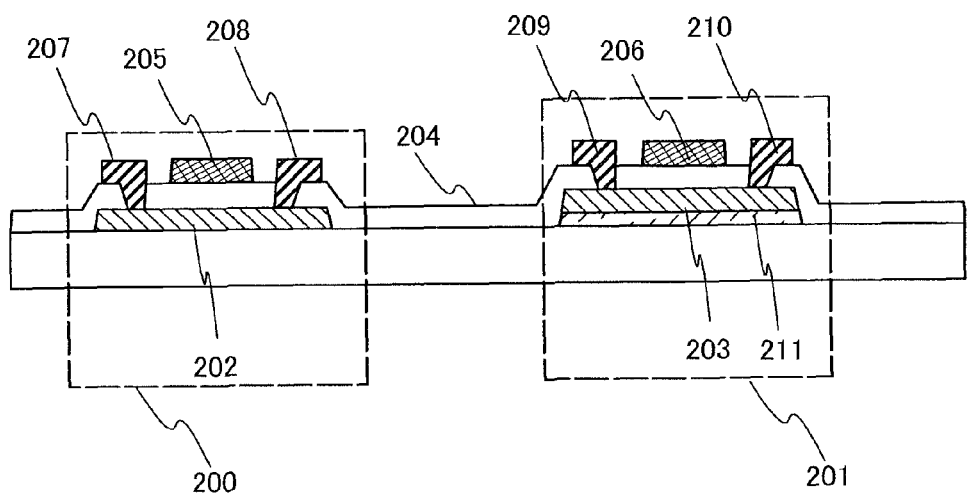
FIG. 4 illustrates a semiconductor device according to one embodiment of the present invention.
Figure 5:
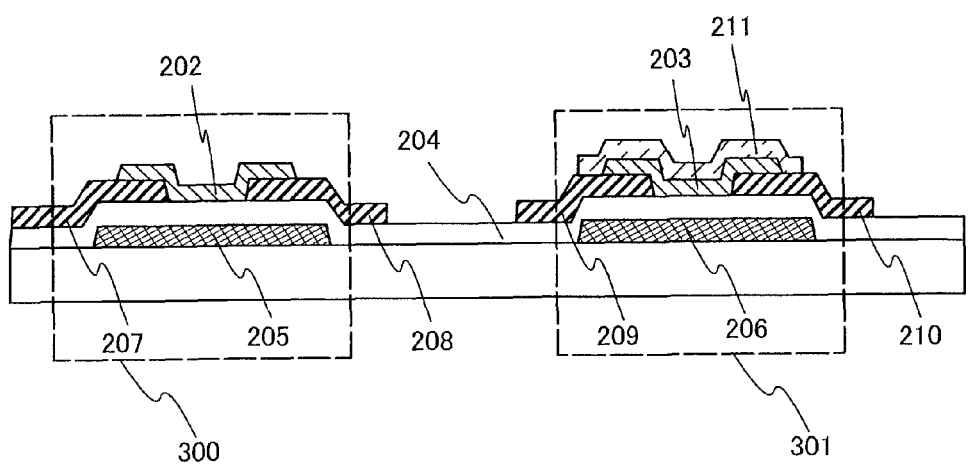
FIG. 5 illustrates a semiconductor device according to one embodiment of the present invention.

This embodiment will describe a transistor which serves as a light receiving element portion of a UV sensor that is one embodiment of the present invention with reference to FIG. 4 and FIG. 5.

Note that in FIG. 5, the same portions as those in FIG. 4 are denoted by the same reference numerals.

FIG. 4 shows top-gate transistors 200 and 201. Here, reference numerals 202 and 203 denote oxide semiconductor films, a reference numeral 204 denotes an insulating film, and reference numerals 205, 206, 207, 208, 209, and 210 each denote a conductive film.

The UV sensor of this invention detects a change in a threshold value of the transistor 200 when a portion to be a channel formation region of the oxide semiconductor film 202 in the transistor 200 which serves as a UV light receiving element is irradiated with UV rays.

The conductive films used for the transistors is formed of a material which rarely allows UV rays to pass through, such as titanium, aluminum, or molybdenum. Thus, when the top-gate transistor is used as the UV light receiving element, it is preferable that the transistor be formed over a substrate which allows UV rays to pass through, and irradiation of UV rays be performed from a side of the substrate where the transistors are not formed.

In the case where a light shielding film is used as in Embodiment 2 and the like, a light shielding film 211 is formed between the transistor 201 that does not serve as a UV light receiving element and a substrate. When the light shielding film 211 is formed of a metal material, it can be formed at the same time as other wirings (for example, a common wiring, and a lead wiring). Note that the oxide semiconductor film 203 is in contact with the light shielding film 211 in FIG. 4, but the films are not necessarily contact with each other. An insulating film or the like may be sandwiched between the oxide semiconductor film 203 and the light shielding film 211.

FIG. 5 shows bottom-gate transistors 300 and 301. When the bottom-gate transistor 300 is used as the UV light receiving element, and irradiation of UV rays is performed through a substrate, the UV rays hardly reach the oxide semiconductor film 202 because of the existence of the conductive film 205. Thus, when the bottom-gate transistor is used as a UV light receiving element, irradiation of UV rays is performed from the side where the transistors are formed. At this time, a substrate which does not allow UV rays to pass through may be used.

As in FIG. 4, the light shielding film 211 may be formed over the transistor 301. Although not shown in figure, in the case where the light shielding film 211 is formed of a metal material, the light shielding film 211 is formed over an interlayer insulating film and the like (not shown in the figure) so as not to be short-circuited. Further, the light shielding film 211 can be formed at the same time as other wirings (for example, a common wiring, and a lead wiring). Note that the oxide semiconductor film 203 is in contact with the light shielding film 211 in FIG. 5, but the films are not necessarily contact with each other. An insulating film or the like may be sandwiched between the oxide semiconductor film 203 and the light shielding film 211.

This embodiment can be implemented combining with another embodiment as appropriate.

Embodiment 6

This embodiment will describe a method for manufacturing a transistor which serves as a receiving element portion of a UV sensor that is one embodiment of the present invention with reference to FIGS. 6A to 6E.

A process of manufacturing a transistor 411 over a substrate 400 will be described below with reference to FIGS. 6A to 6E.

Although there is no particular limitation on a substrate which can be used as the substrate 400 having an insulating surface, it is necessary that the substrate have at least enough heat resistance to a heat treatment to be performed later. For example, a glass substrate made of barium borosilicate glass, aluminoborosilicate glass, or the like can be used.

As a glass substrate, if the temperature of the heat treatment to be performed later is high, a glass substrate whose strain point is 730° C. or higher is preferably used. As a material of the glass substrate, a glass material such as aluminosilicate glass, aluminoborosilicate glass, or barium borosilicate glass is used, for example.

Note that as the above glass substrate, a substrate formed of an insulator such as a ceramic substrate, a quartz substrate, or a sapphire substrate may be used. Alternatively, crystallized glass or the like may be used. Further alternatively, a plastic substrate or the like can be used as appropriate. In addition, a semiconductor substrate of silicon or the like can be used as the substrate.

First, an insulating layer 401 which serves as a base film is formed over the substrate 400 having an insulating surface. It is preferable that an oxide insulating layer such as a silicon oxide layer, a silicon oxynitride layer, an aluminum oxide layer, or an aluminum oxynitride layer be used as the insulating layer 401 which is in contact with the oxide semiconductor layer. The insulating layer 401 can be formed by a plasma CVD method, a sputtering method, or the like. In order to prevent the insulating layer 401 from containing a large amount of hydrogen, the insulating layer 401 is preferably formed by a sputtering method.

In this embodiment, a silicon oxide layer is formed as the insulating layer 401 over the substrate 400 in such a manner that the substrate 400 is transferred to a treatment chamber, a sputtering gas containing high-purity oxygen from which hydrogen and moisture have been removed is introduced, and a silicon semiconductor target is used. The substrate 400 may be at a room temperature or may be heated.

For example, a silicon oxide film is formed by an RF sputtering method under the following conditions: quartz (preferably, synthetic quartz) is used as a target; the substrate temperature is 108° C.; the distance between the substrate and the target (the T-S distance) is 60 mm; the pressure is 0.4 Pa; the high frequency power is 1.5 kW; and the atmosphere is an atmosphere containing oxygen and argon (the flow ratio of oxygen to argon is 1:1 (each flow rate is 25 sccm). The thickness of the silicon oxide film is 100 nm. Instead of quartz (preferably synthetic quartz), a silicon target can be used as a target for depositing the silicon oxide film. As a sputtering gas, oxygen or a mixed gas of oxygen and argon is used.

In that case, the insulating layer 401 is preferably formed removing moisture remaining in the treatment chamber. This is for preventing hydrogen, a hydroxyl group, and moisture from being contained in the insulating layer 401.

In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In a deposition chamber which is evacuated with a cryopump, a hydrogen atom, a compound containing a hydrogen atom, such as water ($H_2O$), and the like are removed, whereby the concentration of impurities in the insulating layer 401 formed in the deposition chamber can be reduced.

As a sputtering gas used for forming the insulating layer 401, a high-purity gas is preferably used in which impurities such as hydrogen, water, a hydroxyl group, or hydride are reduced to such a level that the impurity concentration is represented by the unit "ppm" or "ppb".

Examples of a sputtering method include an RF sputtering method in which a high-frequency power source is used as a sputtering power source, a DC sputtering method in which a direct current source is used, a pulsed DC sputtering method in which a bias is applied in a pulsed manner, and the like. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

Alternatively, a sputtering apparatus provided with a magnet system inside the chamber and used for a magnetron sputtering method, or a sputtering apparatus used for an ECR sputtering method in which plasma generated with the use of microwaves is used without using glow discharge can be used.

Further, as a deposition method using a sputtering method, a reactive sputtering method in which a target substance and a sputtering gas component are chemically reacted with each other during deposition to form a thin compound film thereof, or a bias sputtering method in which a voltage is also applied to a substrate during deposition can be used.

Further, the insulating layer 401 may have a stacked-layer structure in which for example, a nitride insulating layer such as a silicon nitride layer, a silicon nitride oxide layer, an aluminum nitride layer, or an aluminum nitride oxide layer and the oxide insulating layer are stacked in this order from the substrate 400 side.

For example, a high-purity sputtering gas from which hydrogen and moisture are removed and which contains nitrogen is introduced and a silicon target is used, whereby a silicon nitride layer is formed between a silicon oxide layer and a substrate. In this case, the silicon nitride layer is preferably formed removing moisture remaining in a treatment chamber, similarly to the silicon oxide layer.

The substrate may be heated also at the time of the film deposition of the silicon nitride layer.

In the case where a silicon nitride layer and a silicon oxide layer are stacked as the insulating layer 401, the silicon nitride layer and the silicon oxide layer can be deposited in the same treatment chamber with the use of a common silicon target. After an etching gas containing nitrogen is introduced first, a silicon nitride layer is formed using a silicon target mounted in the treatment chamber, and then, the etching gas containing nitrogen is switched to an etching gas containing oxygen and the same silicon target is used to form a silicon oxide layer. Since the silicon nitride layer and the silicon oxide layer can be formed in succession without exposure to the air, impurities such as hydrogen or moisture can be prevented from being adsorbed on a surface of the silicon nitride layer.

Then, an oxide semiconductor film is formed to a thickness of greater than or equal to 2 nm and less than or equal to 200 nm over the gate insulating layer 401.

As pretreatment of the deposition, in order to prevent the oxide semiconductor film from containing hydrogen, a hydroxyl group, and moisture as much as possible, it is preferable to preheat the substrate 400 provided with the insulating layer 401 in a preheating chamber of the sputtering apparatus so that impurities such as hydrogen or moisture adsorbed on the substrate 400 is eliminated and removed. As an evacuation unit provided in the preheating chamber, a cryopump is preferable. Note that this preheating can be omitted. Further, this preheating may be similarly performed on the substrate 400 over which a gate insulating layer 405 has not been formed yet and the substrate 400 over which layers up to a source or drain electrode layer 403 and a source or drain electrode layer 404 have been formed.

Note that before the oxide semiconductor film is formed by a sputtering method, dust attached to a surface of the insulating layer 401 is preferably removed by reverse sputtering in which an argon gas is introduced and plasma is generated. The reverse sputtering refers to a method in which, without application of a voltage to a target side, a high-frequency power source is used for application of a voltage to a substrate side in an argon atmosphere to generate plasma and modify a surface. Note that instead of an argon atmosphere, a nitrogen atmosphere, a helium atmosphere, an oxygen atmosphere, or the like may be used.

The oxide semiconductor film is formed by a sputtering method. The oxide semiconductor film is formed using an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, an In—Sn—O-based oxide semiconductor film, a Sn—O-based oxide semiconductor film, or a Zn—O-based oxide semiconductor film. In this embodiment, the oxide semiconductor film is formed by a sputtering method using an In—Ga—Zn—O-based oxide semiconductor target. In addition, the oxide semiconductor film can be formed by a sputtering method in a rare gas (typically argon) atmosphere, an oxygen atmosphere, or an atmosphere of a rare gas (typically argon) and oxygen. In the case of using a sputtering method, a target containing $SiO_2$ at 2 wt % to 10 wt % inclusive may be used for forming a film.

As the sputtering gas used for forming the oxide semiconductor film, a high-purity gas is preferably used in which impurities such as hydrogen, water, a hydroxyl group, or hydride are reduced to such a level that the impurity concentration is represented by the unit "ppm" or "ppb".

As a target for forming the oxide semiconductor film by a sputtering method, a metal oxide target containing zinc oxide as its main component can be used. As another example of a metal oxide target, an oxide semiconductor target containing In, Ga, and Zn (in a composition ratio, $In_2O_3:Ga_2O_3:ZnO$=1:1:1 [molar ratio]) can be used. Alternatively, an oxide semiconductor target containing In, Ga, and Zn (the composition ratio of $In_2O_3:Ga_2O_3:ZnO$=1:1:2 or 1:1:4 [molar ratio]) may be used. The fill rate of the oxide semiconductor target is greater than or equal to 90% and less than or equal to 100%, preferably, greater than or equal to 95% and less than or equal to 100%. With the use of the oxide semiconductor target with a high filling rate, a dense oxide semiconductor film is formed.

The substrate is held in a treatment chamber kept under reduced pressure, a sputtering gas from which hydrogen and moisture are removed is introduced into the treatment chamber from which remaining moisture is being removed, and the oxide semiconductor film is formed over the substrate 400 with the use of a metal oxide as a target. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the deposition chamber which is evacuated with the cryopump, for example, a hydrogen atom, a compound containing a hydrogen atom, such as water ($H_2O$), (more preferably, also a compound containing a carbon atom), and the like are removed, whereby the concentration of impurities in the oxide semiconductor film formed in the deposition chamber can be reduced. The substrate may be heated when the oxide semiconductor film is formed.

An example of the deposition conditions is as follows: the substrate is at a room temperature, the distance between the substrate and the target is 60 mm, the pressure is 0.4 Pa, the DC power is 0.5 kW, and the atmosphere is an atmosphere containing oxygen and argon (the flow ratio of oxygen to argon is 15 sccm:30 sccm). It is preferable that pulsed direct-current (DC) power supply be used because powder substances (also referred to as particles or dust) generated at the time of deposition can be reduced and the film thickness can be uniform. The oxide semiconductor film preferably has a thickness of 5 nm to 30 nm inclusive. Since appropriate thickness depends on an oxide semiconductor material used, the thickness can be determined as appropriate depending on the material.

Figure 6A:
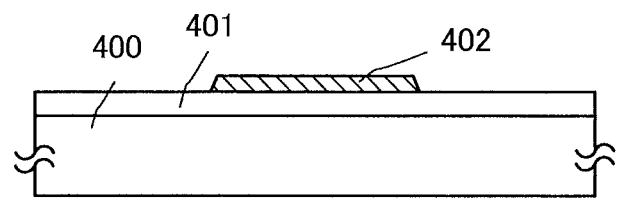
FIGS. 6A to 6E illustrate a manufacturing process of a semiconductor device according to one embodiment of the present invention.

Next, a first photolithography step is performed, so that the oxide semiconductor film is processed into an island-shaped oxide semiconductor layer 402 (see FIG. 6A). Further, a resist mask for forming the island-shaped oxide semiconductor layer 402 may be formed using an ink jet method. Formation of the resist mask by an inkjet method needs no photomask; thus, manufacturing cost can be reduced.

Note that the etching of the oxide semiconductor film may be dry etching, wet etching, or both dry etching and wet etching.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

As the dry etching method, a parallel plate RIE (reactive ion etching) method or an ICP (inductively coupled plasma) etching method can be used. In order to etch the films into desired shapes, etching conditions (the amount of electric power applied to a coil-shaped electrode, the amount of electric power applied to an electrode on a substrate side, the temperature of the electrode on the substrate side, or the like) is adjusted as appropriate.

As an etchant used for wet etching, a solution obtained by mixing phosphoric acid, acetic acid, and nitric acid, an ammonia peroxide mixture (hydrogen peroxide water at 31 wt %: ammonia water at 28 wt %: water=5:2:2), or the like can be used. In addition, ITO07N (produced by KANTO CHEMICAL CO., INC.) may also be used.

The etchant after the wet etching is removed together with the etched materials by cleaning. The waste liquid including the etchant and the material etched off may be purified and the material may be reused. When a material such as indium included in the oxide semiconductor layer is collected from the waste liquid after the etching and reused, the resources can be efficiently used and the cost can be reduced.

The etching conditions (such as an etchant, etching time, and temperature) are appropriately adjusted depending on the material so that the material can be etched into a desired shape.

In this embodiment, the oxide semiconductor film is processed into the island-shaped oxide semiconductor layer 402 by a wet etching method with a mixed solution of phosphoric acid, acetic acid, and nitric acid as an etchant.

In this embodiment, the oxide semiconductor layer 402 is subjected to first heat treatment. The temperature of the first heat treatment is greater than or equal to 400° C. and less than or equal to 750° C., preferably greater than or equal to 400° C. and less than the strain point of the substrate. Here, the substrate is introduced into an electric furnace which is one of heat treatment apparatuses, heat treatment is performed on the oxide semiconductor layer in a nitrogen atmosphere at 450° C. for one hour, and then, and water and hydrogen are prevented from being mixed into the oxide semiconductor layers again; thus the oxide semiconductor layer is obtained. Dehydration or dehydrogenation of the oxide semiconductor layer 402 can be performed through the first heat treatment.

Further, a heat treatment apparatus used is not limited to an electric furnace, and a device for heating an object to be processed by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, for example, nitrogen or a rare gas such as argon is used.

For example, as the first heat treatment, GRTA by which the substrate is moved into an inert gas heated to a high temperature as high as 650° C. to 700° C., heated for several minutes, and moved out of the inert gas heated to the high temperature may be performed. With GRTA, high-temperature heat treatment for a short period of time can be achieved.

Note that in the first heat treatment, it is preferable that water, hydrogen, and the like be not contained in the atmosphere of nitrogen or a rare gas such as helium, neon, or argon. It is preferable that the purity of nitrogen or the rare gas such as helium, neon, or argon which is introduced into a heat treatment apparatus be set to 6N (99.9999%) or higher, preferably 7N (99.99999%) or higher (that is, the impurity concentration is 1 ppm or lower, preferably 0.1 ppm or lower).

The oxide semiconductor layer can be crystallized to be a microcrystalline film or a polycrystalline film in some cases because of conditions of the first heat treatment or materials of the oxide semiconductor layer. For example, the oxide semiconductor layer may crystallize to become a microcrystalline oxide semiconductor film having a degree of crystallization of 90% or more, or 80% or more. Alternatively, depending on the condition of the first heat treatment and the material for the oxide semiconductor layer, the oxide semiconductor layer might become an amorphous oxide semiconductor film containing no crystalline component. The oxide semiconductor layer may become an oxide semiconductor film in which a microcrystalline portion (with a grain diameter greater than or equal to 1 nm and less than or equal to 20 nm, typically greater than or equal to 2 nm and less than or equal to 4 nm) is mixed into an amorphous oxide semiconductor.

The first heat treatment for the oxide semiconductor layer can be performed before the oxide semiconductor film is processed into the island-shaped oxide semiconductor layer. In that case, the substrate is taken out from the heat apparatus after the first heat treatment, and then a photolithography step is performed.

The heat treatment which has an effect of dehydrating or dehydrogenating the oxide semiconductor layer may be performed at any of the following timings: after the oxide semiconductor layer is formed; after the source electrode and the drain electrode are formed over the oxide semiconductor layer; and after the gate insulating layer is formed over the source electrode and the drain electrode.

Next, a conductive film is formed over the insulating layer 401 and the oxide semiconductor layer 402. The conductive film may be formed with, for example, a sputtering method or a vacuum evaporation method. As a material of the conductive film, an element selected from Al, Cr, Cu, Ta, Ti, Mo, or W; an alloy containing any of these elements as a component; an alloy film containing any of these elements in combination; and the like can be given. Further, one or more materials selected from manganese, magnesium, zirconium, beryllium, and yttrium may be used. Further, the metal conductive film may have a single-layer structure or a stacked-layer structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. Alternatively, a film of one or a plurality of elements selected from titanium (Ti), tantalum (Ta), tungsten (W), molybdenum (Mo), chromium (Cr), neodymium (Nd), and scandium (Sc) combined with Al, an alloy film containing a plurality of the above elements, or a nitride film thereof may be used.

Figure 6B:
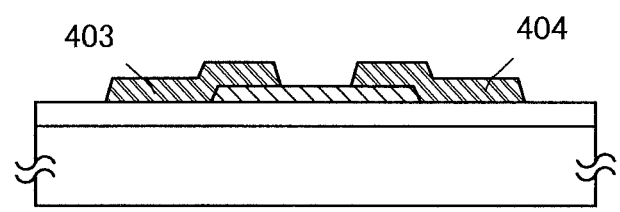

Next, a resist mask is formed over the conductive film by a second photolithography step, and the source or drain electrode layers 403 and 404 are formed by selective etching, and then, the resist mask is removed (see FIG. 6B). Note that the source electrode layer and the drain electrode layer preferably have tapered shapes because coverage with the gate insulating layer stacked thereover can be improved.

In this embodiment, a titanium film with a thickness of 150 nm is formed by a sputtering method for the source or drain electrode layer 403 and the source or drain electrode layer 404.

Note that in order to prevent the oxide semiconductor layer 402 from being removed and the insulating layer 407 therebelow from being exposed at the time of the etching of the conductive film, each material and etching conditions are adjusted as appropriate.

In this embodiment, a Ti film is used as the conductive film and an In—Ga—Zn—O-based oxide semiconductor is used as the oxide semiconductor layer 402, and an ammonium hydrogen peroxide solution (a mixed solution of ammonia, water, and a hydrogen peroxide solution) is used as an etchant.

Note that, in the second photolithography step, only part of the oxide semiconductor layer 402 is etched, whereby an oxide semiconductor layer having a groove (a depressed portion) is formed in some cases. In addition, the resist mask for forming the source or drain electrode layer 403 and the source or drain electrode layer 404 may be formed by an ink-jet method. Formation of the resist mask by an inkjet method needs no photomask; thus, manufacturing cost can be reduced.

UV rays, a KrF laser beam, or an ArF laser beam is used for light exposure for forming the resist mask in the second photolithography step. A channel length L of a transistor to be formed later depends on a width of a distance between a bottom portion of the source electrode layer and a bottom portion of the drain electrode layer which are adjacent to each other over the oxide semiconductor layer 402. Note that when light exposure is performed in the case where the channel length L is shorter than 25 nm, extreme ultraviolet with extremely short wavelengths of several nanometers to several tens of nanometers is used for light exposure for forming the resist mask in the second photolithography step. Light exposure with extreme ultraviolet leads to a high resolution and a large depth of focus. Accordingly, the channel length L of the transistor to be formed later can be set to 10 nm to 1000 nm inclusive. Thus, the operation speed of a circuit can be increased, and further, off-current can be significantly small so that low power consumption can be achieved.

Figure 6C:
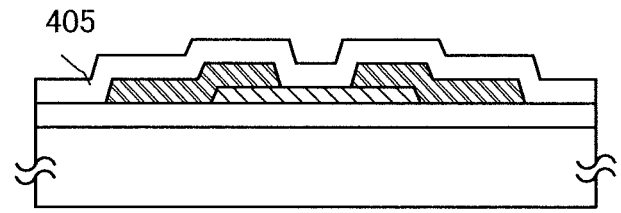

Next, the gate insulating layer 405 is formed over the insulating layer 401, the oxide semiconductor layer 402, the source or drain electrode layer 403, and the source or drain electrode layer 404 (see FIG. 6C).

The gate insulating layer 405 can be formed to have a single-layer or stacked-layer structure using a silicon oxide layer, a silicon nitride layer, a silicon oxynitride layer, a silicon nitride oxide layer, or an aluminum oxide layer by a plasma CVD method, a sputtering method, or the like. Note that the gate insulating layer 405 is preferably formed by a sputtering method so that the gate insulating layer 405 contains hydrogen as little as possible. In the case where a silicon oxide film is formed by a sputtering method, a silicon target or a quartz target is used as a target and a mixed gas of oxygen and argon is used as a sputtering gas.

The gate insulating layer 405 can have a structure in which a silicon oxide layer and a silicon nitride layer are stacked from the source or drain electrode layer 403 and the source or drain electrode layer 404 side. For example, a silicon oxide layer ($SiO_x$ ($x>0$)) with a thickness of 5 nm to 300 nm inclusive may be formed as a first gate insulating layer and a silicon nitride layer ($SiN_y$ ($y>0$)) with a thickness of 50 nm to 200 nm inclusive may be stacked as a second gate insulating layer over the first gate insulating layer by a sputtering method; thus, the gate insulating layer with a thickness of 100 nm may be formed. In this embodiment, a silicon oxide layer with a thickness of 100 nm is formed by an RF sputtering method in an atmosphere containing oxygen and argon (the flow rate of oxygen is 25 sccm, and the flow rate of argon is 25 sccm), under conditions where the pressure is 0.4 Pa, and a high-frequency power source is 1.5 kW.

Figure 6D:
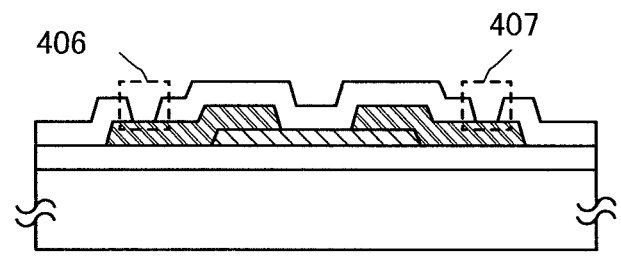

Next, a third photolithography step is performed to form a resist mask, and etching is selectively performed to remove part of the gate insulating layer 405, so that openings 406 and 407 reaching the source or drain electrode layer 403 and the source or drain electrode layer 404 are formed (see FIG. 6D).

Next, after forming the conductive film over the gate insulating layer 405 and the openings 406 and 407, a gate electrode layer 410, wiring layers 408 and 409 are formed. Note that a resist mask may be formed by an inkjet method. Formation of the resist mask by an inkjet method needs no photomask; thus, manufacturing cost can be reduced.

The gate electrode layer 410 and the wiring layers 408 and 409 can be formed to have a single-layer or stacked-layer structure using a metal material such as molybdenum, titanium, chromium, tantalum, tungsten, aluminum, copper, neodymium, or scandium, or an alloy material which contains any of these materials as its main component.

For example, as a two-layer structure of each of the gate electrode layer 410, the wiring layer 408, and the wiring layer 409, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a stacked-layer structure of a tungsten layer or a tungsten nitride layer, a layer of an alloy of aluminum and silicon or an alloy of aluminum and titanium, and a titanium nitride layer or a titanium layer is preferable. Note that the gate electrode layer can be formed from a light-transmitting conductive film. As an example of a material of the light-transmitting conductive film, a light-transmitting conductive oxide or the like can be given.

In this embodiment, a titanium film with a thickness of 150 nm is formed as the gate electrode layer 410, the wiring layers 408 and 409 by a sputtering method.

Next, a second heat treatment is performed, preferably in an inert gas atmosphere or oxygen gas atmosphere (preferably at 200 to 400° C., e.g. 250 to 350° C.). In this embodiment, the second heat treatment is performed in a nitrogen atmosphere at 250° C. for one hour. The second heat treatment may be performed after a protective insulating layer or a planarization insulating layer is formed over the transistor 411.

Further, heat treatment may be performed at 100° C. to 200° C. for from one hour to 30 hours in the air. This heat treatment may be performed at a fixed heating temperature. Alternatively, the following change in the heating temperature may be conducted plural times repeatedly: the heating temperature is increased from a room temperature to a temperature of 100° C. to 200° C. and then decreased to a room temperature. Further, this heat treatment may be performed under a reduced pressure. Under the reduced pressure, the heat treatment time can be shortened.

Figure 6E:
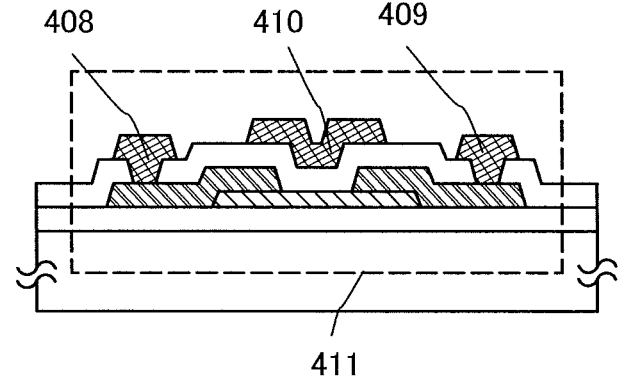

Through the above-described process, the transistor 411 including the oxide semiconductor layer 402 in which the concentration of hydrogen, moisture, hydride, and hydroxide is reduced can be formed (see FIG. 6E).

Further, a protective insulating layer or a planarization insulating layer for planarization may be provided over the transistor 411. For example, the protective insulating layer may be formed with a single-layer structure or a stacked-layer structure using any of a silicon oxide layer, a silicon nitride layer, a silicon oxynitride layer, a silicon nitride oxide layer, and an aluminum oxide layer.

The planarization insulating layer can be formed using an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. The planarization insulating layer may be formed by stacking a plurality of insulating films formed of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method for forming the planarization insulating layer, and the planarization insulating layer can be formed, depending on the material, by a method such as a sputtering method, an SOG method, spin coating, dip coating, spray coating, or a droplet discharge method (such as an ink-jet method, screen printing, offset printing, or the like), or a tool (equipment) such as a doctor knife, a roll coater, a curtain coater, or a knife coater.

This embodiment can be implemented combining with another embodiment as appropriate.

When the oxide semiconductor film is formed in the above manner, remaining moisture in a reaction atmosphere is removed; thus, the concentration of hydrogen and that of hydride in the oxide semiconductor film can be reduced. Thus, the oxide semiconductor film can be stabilized.

Further, the transistor included in the UV sensor described in Embodiment 3 or 4 and the transistor included in the peripheral circuit and the like can be formed through the same step as the transistor described in this embodiment. When the plurality of transistors is formed through the same manufacturing step, the number of manufacturing steps can be reduced.

In this embodiment, a method for manufacturing a top-gate transistor is described; however, a transistor having a different shape can be formed by changing the order of processes and the mask to be used. Thus, it is desirable that the transistor have the most appropriate shape for forming the peripheral circuit and the like all at once.

As described above, in the UV sensor provided with a transistor including an oxide semiconductor layer, a UV sensor which has stable electric characteristics and high reliability can be provided.

This embodiment can be implemented combining with another embodiment as appropriate.

Embodiment 7

This embodiment will describe an example of a method for manufacturing a UV sensor that is one embodiment of the present invention over a flexible substrate with reference to FIGS. 7A to 7D.

Figure 7A:
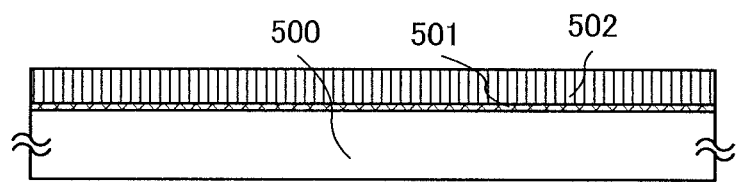
FIGS. 7A to 7D illustrates a separation process of a semiconductor device according to one embodiment of the present invention.

First, a layer 502 to be separated including a UV sensor portion, or the UV sensor portion and a peripheral circuit and the like is formed over a substrate 500 having an insulating surface, with a separation layer 501 interposed therebetween (see FIG. 7A).

As the substrate 500, a glass substrate, a quartz substrate, a sapphire substrate, a ceramic substrate, a metal substrate provided with an insulating layer on the surface, or the like, which is a substrate having heat resistance that is high enough to form a high-quality protective film can be used.

Since a substrate with low flexibility which can be used for manufacture normal displays is used for the substrate, a transistor for high-resolution display can be provided.

The separation layer 501 is formed by a sputtering method, a plasma CVD method, a coating method, a printing method, or the like to be a single layer or a stacked layer using an element such as tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); an alloy material containing the element as its main component; or a compound material containing the element as its main component. A crystalline structure of a layer containing silicon may be any one of an amorphous structure, a microcrystalline structure, and a polycrystalline structure. Note that a coating method includes a spin-coating method, a droplet discharge method, a dispensing method, a nozzle-printing method, and a slot die coating method in its category here.

When the separation layer 501 has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum is formed. Note that the mixture of tungsten and molybdenum corresponds to an alloy of tungsten and molybdenum, for example.

In the case where the separation layer 501 has a stacked-layer structure, a tungsten layer, a molybdenum layer, or a layer containing a mixture of tungsten and molybdenum is preferably formed as a first layer. Oxide of tungsten, molybdenum, or a mixture of tungsten and molybdenum; nitride of tungsten, molybdenum, or a mixture of tungsten and molybdenum; oxynitride of tungsten, molybdenum, or a mixture of tungsten and molybdenum; or nitride oxide of tungsten, molybdenum, or a mixture of tungsten and molybdenum is preferably formed as a second layer.

In the case where the separation layer 501 is formed to have a stacked-layer structure including a layer containing tungsten and a layer containing an oxide of tungsten, it may be utilized that the layer containing tungsten is formed first and an insulating layer formed of oxide is formed thereover so that a layer containing an oxide of tungsten is formed at the interface between the tungsten layer and the insulating layer. The same applies to the case of forming a layer containing nitride, oxynitride, or nitride oxide of tungsten. After a layer containing tungsten is formed, a silicon nitride layer, a silicon oxynitride layer, or a silicon nitride oxide layer may be formed thereover. Further, the surface of the layer containing tungsten may be subjected to thermal oxidation treatment, oxygen plasma treatment, or treatment using a strong oxidizing solution such as ozone water to form a layer containing oxide of tungsten. The plasma treatment and the heat treatment may be performed in an atmosphere of oxygen, nitrogen, or dinitrogen monoxide alone, or a mixed gas of any of these gasses and another gas.

Subsequently, the layer 502 to be separated is formed over the separation layer 501. The layer 502 to be separated includes the transistor and the interlayer insulating film which are manufactured in Embodiment 6. As in Embodiment 8 that will be described below, in the case where a transistor in the sensor portion and a transistor in the pixel portion are formed at the same time, a pixel electrode may be included in the transistor in the pixel portion.

Figure 7B:
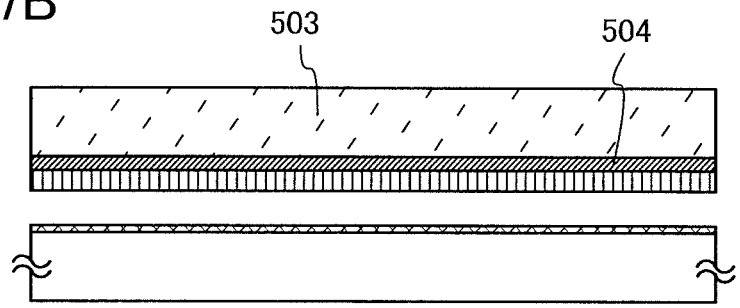

Next, the layer 502 to be separated and a temporary supporting substrate 503 are adhered to each other using an adhesive 504 for separation, which is followed by separation of the layer 502 to be separated from the substrate 500 using the separation layer 501. By this process, the layer 502 to be separated is placed on the temporary supporting substrate 503 side (FIG. 7B).

As the temporary supporting substrate 503, a glass substrate, a quartz substrate, a sapphire substrate, a ceramic substrate, a metal substrate, and the like can be used. Alternatively, a plastic substrate which can withstand the processing temperature in this embodiment mode, or a flexible substrate such as a film can also be used.

As the adhesive 504 for separation which is used here, an adhesive which is soluble in water or a solvent, an adhesive which is capable of being plasticized upon irradiation of UV light, and the like are used so that the temporary supporting substrate 503 and the layer 502 to be separated can be chemically or physically separated when necessary.

Any of various methods can be used as appropriate as the process for transferring the layer to be separated to the temporary supporting substrate. When, as the separation layer, a film including a metal oxide film is formed on the side in contact with the layer to be separated, the metal oxide film is embrittled by being crystallized, and thus the layer to be separated can be separated from the substrate. When an amorphous silicon film containing hydrogen is formed as the separation layer between the substrate having high heat resistance and the layer to be separated, by removing the amorphous silicon film by laser light irradiation or etching, the layer to be separated can be separated from the substrate. In addition, after a film including a metal oxide film is formed as the separation layer on the side in contact with the layer to be separated, the metal oxide film is embrittled by being crystallized, and a part of the separation layer is removed by etching using a solution or a halogen fluoride gas such as $NF_3$, $BrF_3$, or $ClF_3$, the separation can be performed at the embrittled metal oxide film. Furthermore, a method may be used in which a film containing nitrogen, oxygen, hydrogen, or the like (for example, an amorphous silicon film containing hydrogen, an alloy film containing hydrogen, an alloy film containing oxygen, or the like) is used as the separation layer, and the separation layer is irradiated with laser light to release the nitrogen, oxygen, or hydrogen contained in the separation layer as a gas, thereby promoting separation between the layer to be separated and the formation substrate.

Furthermore, a method in which the substrate over which the layer to be separated is formed is removed mechanically or by etching using a solution or a halogen fluoride gas such as $NF_3$, $BrF_3$, or $ClF_3$, or the like may be used. In this case, the separation layer is not necessarily provided.

When a plurality of the above-described separation methods are combined, the transfer process can be conducted easily. For example, separation can be performed with physical force (by a machine or the like) after performing laser light irradiation, etching on the separation layer with a gas, a solution, or the like, or mechanical removal with a sharp knife, scalpel, or the like so that the separation layer and the layer to be separated can be easily separated from each other.

Alternatively, separation of the layer to be separated from the substrate may be carried out after a liquid is made to penetrate an interface between the separation layer and the layer to be separated. Further alternatively, the separation may be performed while pouring a liquid such as water during the separation.

As another separation method, in the case where the separation layer 501 is formed using tungsten, it is preferable that the separation be performed while etching the separation layer 501 using a mixed solution of ammonium water and a hydrogen peroxide solution.

Figure 7C:
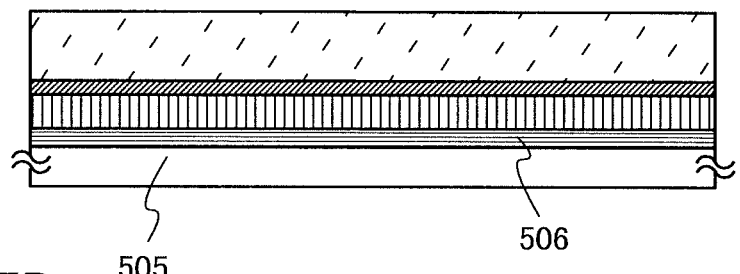
Figure 7D:

Next, the layer 502 to be separated which is separated from the substrate 500 to expose the separation layer 501 is adhered to a flexible substrate 505 using an adhesive layer 506 which is formed of a different adhesive from the adhesive 504 for separation (see FIG. 7C).

As a material of the adhesive layer 506, various curable adhesives, e.g., a light curable adhesive such as a UV curable adhesive, a reactive curable adhesive, a thermal curable adhesive, and an anaerobic adhesive can be used.

As the flexible substrate 505, any of a variety of substrates having flexibility and a light-transmitting property with respect to visible light can be used, and a film of an organic resin or the like is preferably used. As the organic resin, for example, a polyester resin such as polyethylene terephthalate (PET) or polyethylene naphthalate (PEN), an acrylic resin, a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinylchloride resin, or the like can be used.

Over the flexible substrate 505, a protective film 125 with low water permeability, such as a film containing nitrogen and silicon, e.g., silicon nitride or silicon oxynitride, a film containing nitrogen and aluminum such as aluminum nitride, or an aluminum oxide film may be formed in advance.

After that, the temporary supporting substrate 503 is removed by dissolving or plasticizing the adhesive 504 for separation. After the temporary supporting substrate 503 is removed, the adhesive 504 for separation is removed using water, a solvent, or the like (see FIG. 7D).

Accordingly, the layer 502 to be separated including the transistor can be formed over the flexible substrate 505. By this method, a UV sensor can be formed over a flexible substrate.

Note that this embodiment can be implemented combining with another embodiment as appropriate.

Embodiment 8

This embodiment will describe examples of specific structures of electronic devices on which a UV sensor that is an embodiment of the present invention is mounted with reference to FIG. 8, FIG. 9, FIG. 10, FIG. 11, FIG. 12, and FIGS. 13A to 13G.

Figure 8:
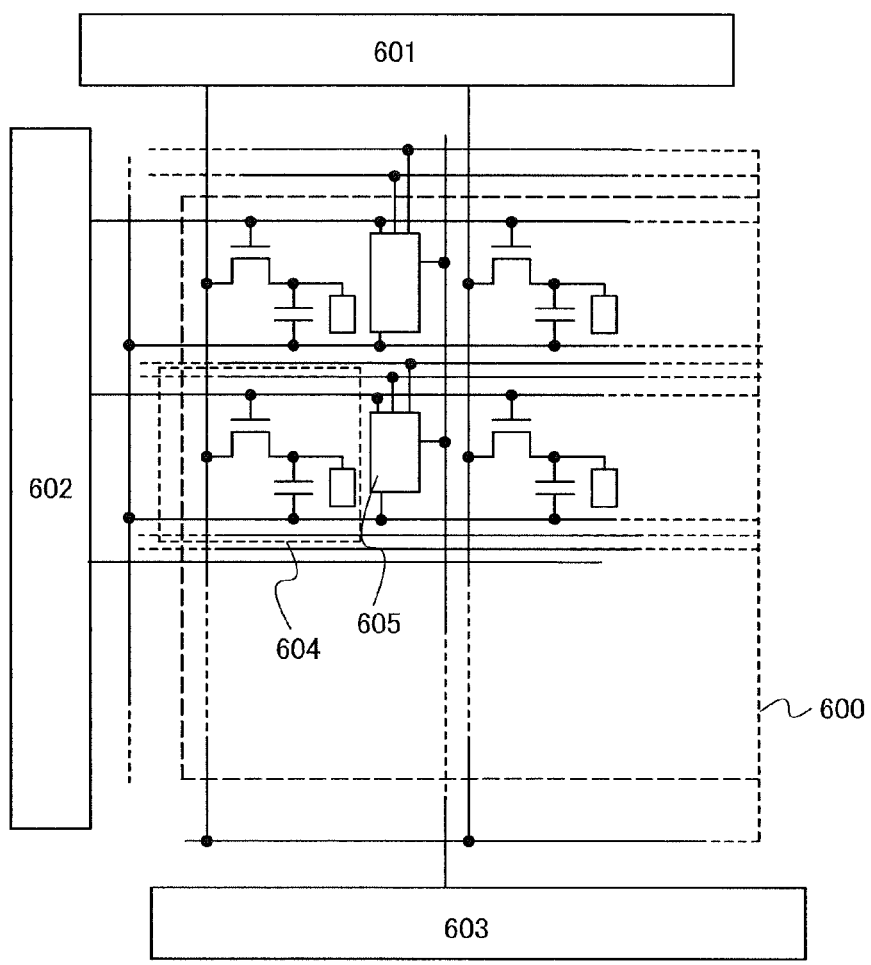
FIG. 8 is an equivalent circuit diagram illustrating a semiconductor device according to one embodiment of the present invention.

FIG. 8 shows one example of a circuit configuration of a liquid crystal display on which a UV sensor is mounted. Reference numerals 600, 601, 602 and 603 denote a pixel region, a source line driver circuit, a gate line driver circuit, and a sensor processing portion, respectively. In addition, reference numerals 604 and 605 denote a pixel portion and a UV sensor portion, respectively.

The sensor processing portion 603 includes the amplifier circuit 102 described in Embodiments 1 to 3, or the inverter 107 described in Embodiment 4. However, the structure of the sensor processing portion 603 is not limited thereto; a switch may be provided for a wiring connected to the UV sensor portion 605, and a detected result may be fed back to the source line driver circuit 601 or a light source.

Figure 9:
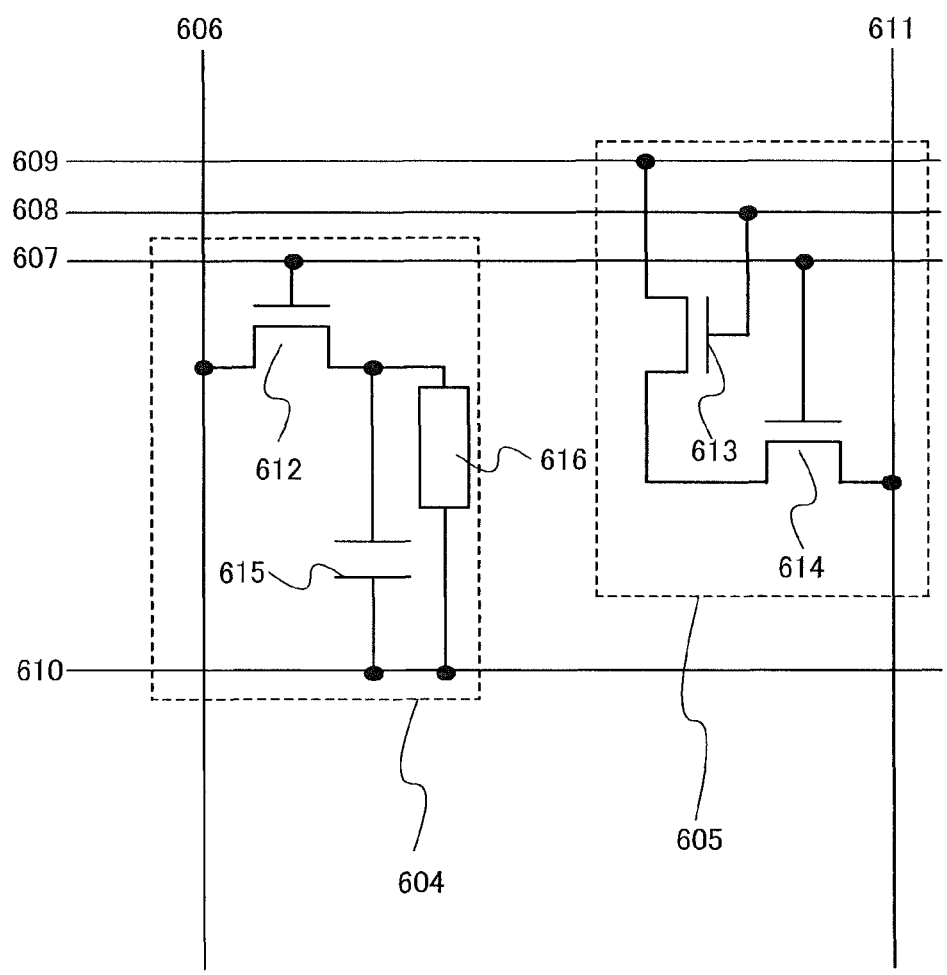
FIG. 9 is an equivalent circuit diagram illustrating a semiconductor device according to one embodiment of the present invention.
Figure 10:
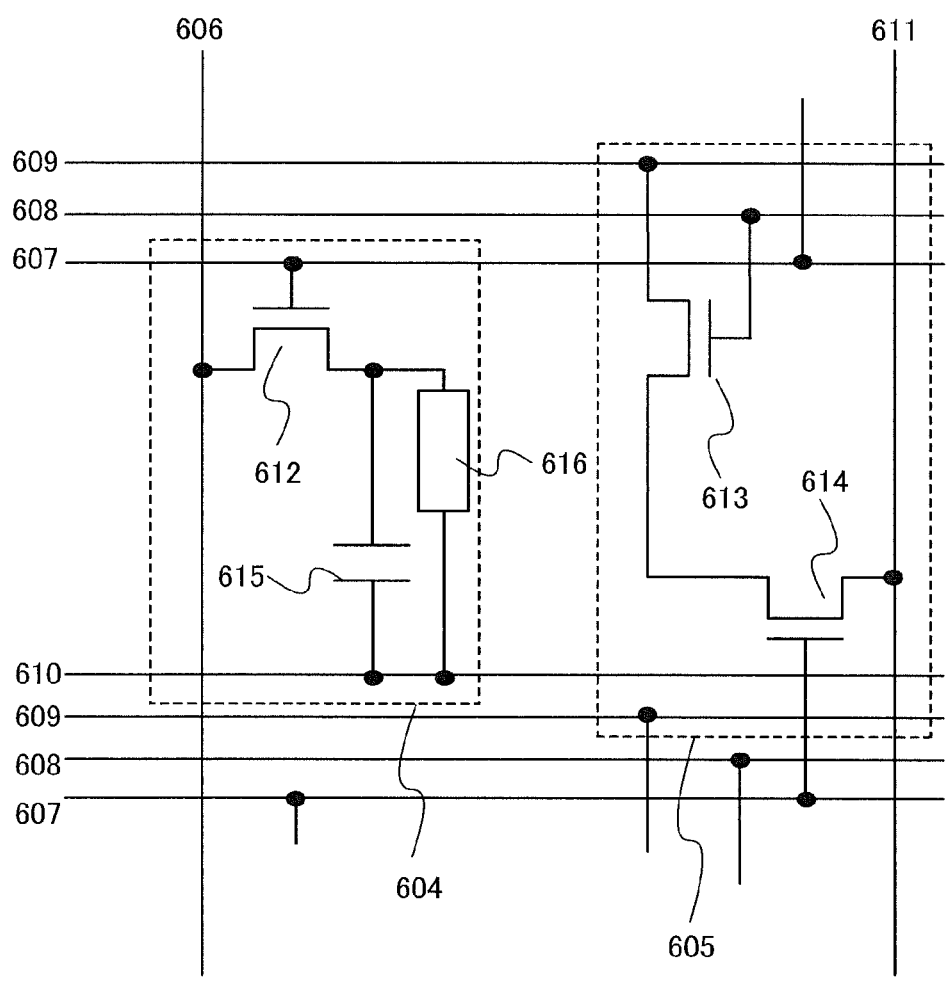
FIG. 10 is an equivalent circuit diagram illustrating a semiconductor device according to one embodiment of the present invention.

FIG. 9 shows one specific example of the pixel portion 604 and the UV sensor portion 605. Here, reference numeral 606 is defined as a first wiring; 607, a second wiring; 608, a third wiring; 609, a fourth wiring; 610, a fifth wiring; 611, a sixth wiring, 612 to 614, transistors; 615, a capacitor; and 616, a liquid crystal element.

When FIG. 8 and FIG. 9 correspond to each other, the first wiring 606 is connected to the source line driver circuit 601, and the second wiring 607 is connected to the gate line driver circuit 602. The third wiring 608 is connected to a voltage source or the variable voltage source 103 illustrated in Embodiment 2, and the fourth wiring 609 supplies a positive potential (VDD). The fifth wiring 610 is grounded, and the sixth wiring 611 is connected to the sensor processing portion 603.

The transistor 612 is included in the pixel portion 604. A gate of the transistor 612 is connected to the second wiring, one of a source and a drain thereof is connected to the first wiring 606 and the other of the source and the drain thereof is connected to the capacitor 615 and a pixel electrode included in the liquid crystal element 616.

The transistors 613 and the transistor 614 are included in the UV sensor portion 605. A gate of the transistor 613 is connected to the third wiring 608, one of a source and a drain thereof is connected to the fourth wiring 609 and the other of the source and the drain thereof is connected to one of a source and a drain of the transistor 614. A gate of the transistor 614 is connected to the second wiring 607, and the other of the source and the drain thereof is connected the sixth wiring 611.

In the UV sensor portion 605, the transistor 613 serves as a UV light receiving element. As described in Embodiments 1 to 4, by the negative shift of the threshold value corresponding to the wavelength of UV rays with which the transistor 613 is irradiated, a change in drain current of the transistor 613 is read out. In the transistor 614, in accordance with a signal supplied from the second wiring 607, the drain current is output to the sensor processing portion 603.

Note that the gate of the transistor 614 may be connected to another second wiring 607 which locates in a different row from the second wiring 607 connected to the transistor 612. The gate of the transistor 614 is not necessarily connected to the second wiring 607 and a new wiring may be formed. However, by connecting the gate of the transistor 614 to the second wiring 607, the number of wirings can be reduced, whereby an aperture ratio of a pixel is improved and the size of a pixel can be small.

Figure 11:
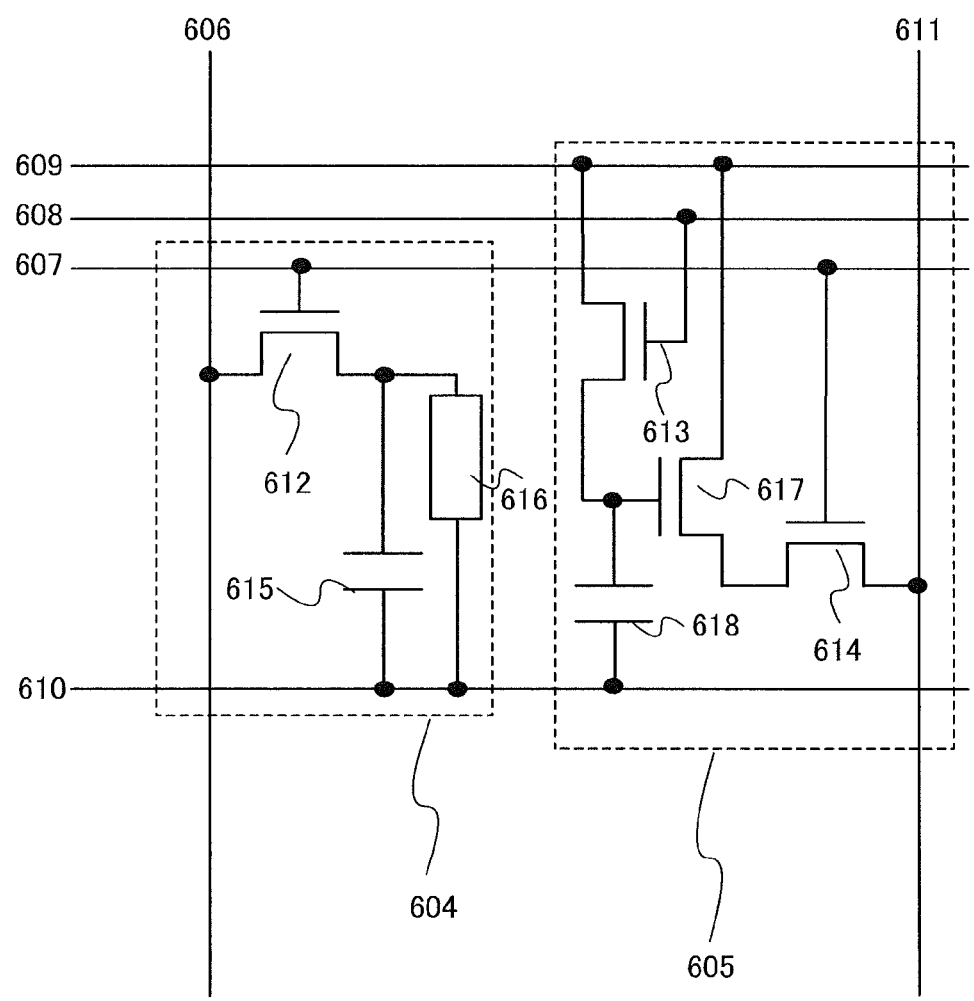
FIG. 11 is an equivalent circuit diagram illustrating a semiconductor device according to one embodiment of the present invention.

As shown in FIG. 11, the UV sensor portion 605 may include a transistor 617 and a capacitor 618. In that case, the gate of the transistor 617 is connected to the other of the source and the drain of the transistor 613, one of a source and a drain of the transistor 617 is connected to the fourth wiring 609, and the other of the source and the drain of the transistor 617 is connected to one of the source and the drain of the transistor 614. One of electrodes included in the capacitor 618 is connected to the gate of the transistor 617 and the other of the electrodes is connected to the fifth wiring 610.

The capacitor 618 accumulates the drain current supplied from the transistor 613 as an electric charge, and holds a gate potential of the transistor 617. After that, the transistor 614 outputs a signal to the sensor processing portion 603 in accordance with a signal supplied from the second wiring 607.

Figure 12:
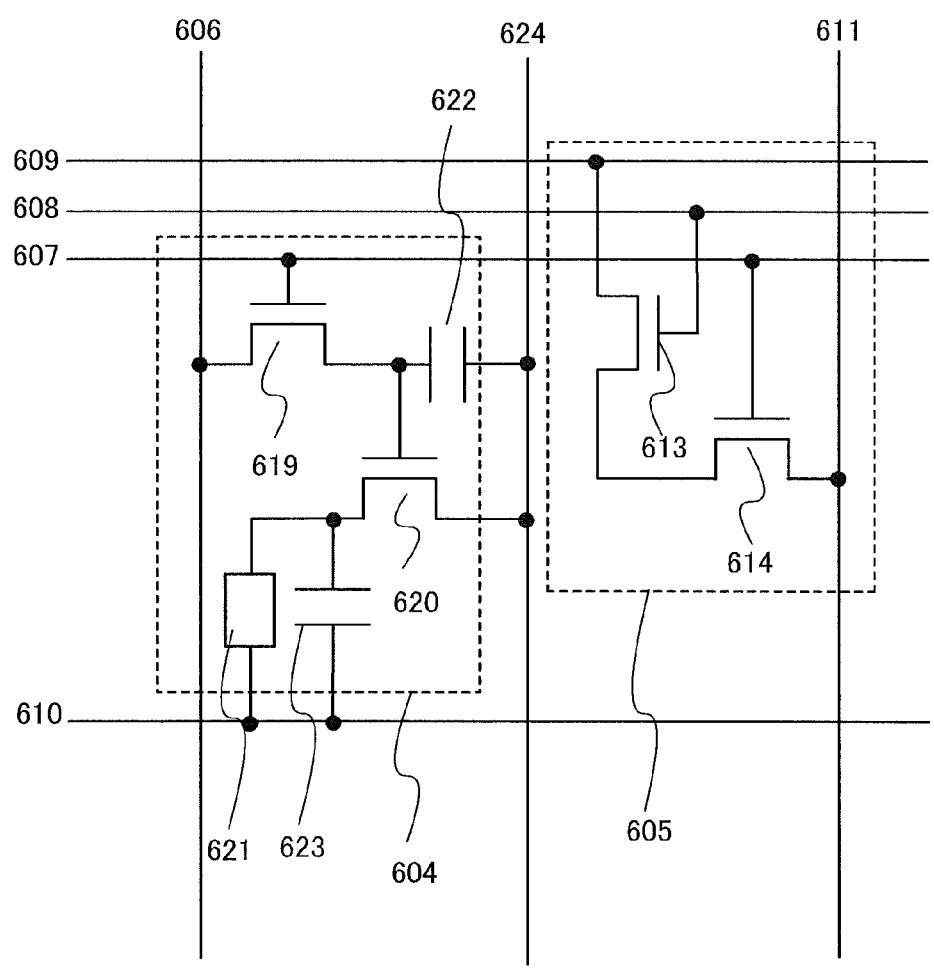
FIG. 12 is an equivalent circuit diagram illustrating a semiconductor device according to one embodiment of the present invention.

FIG. 12 illustrates an example of a circuit configuration of an EL display on which a UV sensor is mounted. In the pixel portion 604, transistors 619 and 620, a light-emitting element 621, and capacitors 622 and 623 are included, and a seventh wiring 624 is formed. A structure disclosed in FIG. 9 is applied to the UV sensor portion 605; however, the structure illustrated in FIG. 10 or 11 may be applied.

A gate of the transistor 619 is connected to the second wiring 607, one of a source and a drain of the transistor 619 is connected to the first wiring 606, and the other of the source and the drain of the transistor 619 is connected to a gate of the transistor 620 and one of the electrodes included in the capacitor 622. One of a source and a drain of the transistor 620 is connected to the seventh wiring 624 and the other of the source and the drain of the transistor 620 is connected to a pixel electrode which is connected to a light-emitting element and one of the electrodes included in the capacitor 623. Further, the seventh wiring 624 functions as a power supply line.

The light-emitting element 621 includes an anode, a cathode, and a layer containing a light-emitting substance. The layer containing a light-emitting substance includes at least one of an electron transport layer, a hole blocking layer, a light-emitting layer, a hole transport layer, and a hole injection layer. In the light-emitting element, light generated by recombination of carriers in the layer containing a light-emitting substance is emitted outside from one or both of the anode and the cathode.

The capacitors 622 and 623 are not necessarily provided and can be omitted. Further, the size of the capacitor 623 can be changed as appropriate for each pixel. For example, a capacitor 623 included in a pixel for emitting blue light can be made larger than a capacitor 623 included in a pixel for emitting a red light. As described above, by changing the size of the capacitor depending on the properties of a light-emitting substance used for each pixel, light emission of each color can be controlled and degradation of a light-emitting element can be suppressed.

Note that the transistors 612 to 614, 617, 619, and 620 may have the same structure. In addition, the capacitors 615, 618, 622, and 623 may be formed from the same materials. In that case, because the pixel portion 604 and the UV sensor portion 605 can be formed in the same manufacturing process, the number of steps can be reduced, which is preferable. However, the threshold values of the transistors other than the transistor 613 may be negatively shifted by irradiating the transistors with UV rays and malfunction may occur. To prevent this, the transistors 612, 614, 617, 619, and 620 are desirably covered with a shielding film. The light shielding film described in Embodiments 3 and 4 can be used here.

By using such a circuit configuration, an electronic device in which UV rays can be detected in a pixel region while an image is displayed in the pixel region can be provided. In that case, a sensor may be driven in a region where an image is not displayed while an image is displayed in part of the pixel region, or a sensor may be driven while an image is displayed in the whole pixel region.

Specific examples of electronic devices each on which a pixel region having the above-described circuit configuration is mounted will be described with reference to FIGS. 13A to 13G. FIGS. 13A to 13G illustrate structures of electronic devices of this embodiment.

Figure 13A:
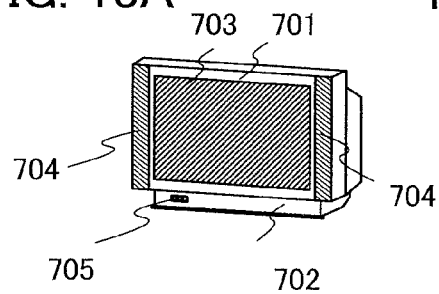
FIGS. 13A to 13G are external views illustrating examples of electronic devices according to one embodiment of the present invention.

FIG. 13A illustrates a display device, which includes a housing 701, a support base 702, a display portion 703, speaker portions 704, video input terminals 705, and the like. The above-described display device can be applied to the display portion 703. Note that the display device includes all display devices such as display devices for personal computers, for receiving TV broadcast, and for displaying advertisements, in its category.

Figure 13B:
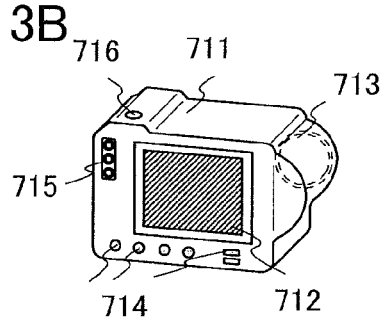

FIG. 13B illustrates a digital still camera, which includes a main body 711, a display portion 712, an image receiving portion 713, operation keys 714, an external connection port 715, a shutter button 716, and the like. The above-described display device can be applied to the display portion 712.

Figure 13C:
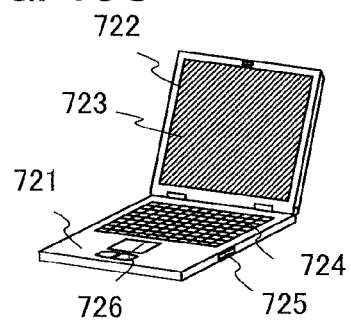

FIG. 13C illustrates a laptop, which includes a main body 721, a housing 722, a display portion 723, a keyboard 724, an external connection port 725, a pointing device 726, and the like. The above-described display device can be applied to the display portion 723.

Figure 13D:
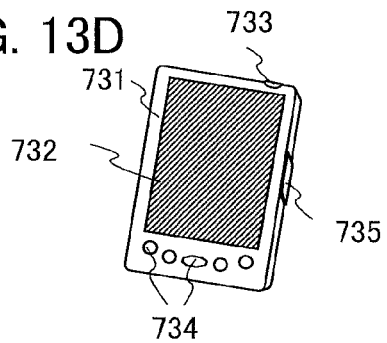

FIG. 13D illustrates a mobile computer including a main body 731, a display portion 732, a switch 733, operation keys 734, an infrared port 735, and the like. The above-described display device can be applied to the display portion 732.

Figure 13E:
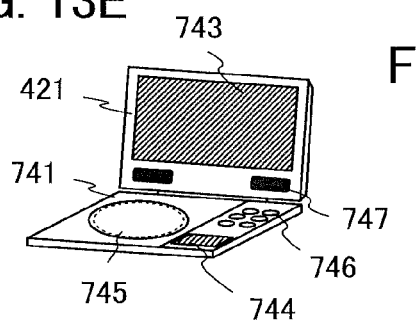

FIG. 13E illustrates a portable image reproducing device provided with a recording medium (specifically, a DVD reproducing device), which includes a main body 741, a housing 742, a display portion A743, a display portion B744, a recording medium (such as a DVD) reading portion 745, operation keys 746, speaker portions 747, and the like. The display portion A743 mainly displays image data, while the display portion B744 mainly displays text data. The above-described display device can be used for the display portion A743 and the display portion B744. Note that the image reproducing device provided with a recording medium includes a home-use game machine and the like.

Figure 13F:
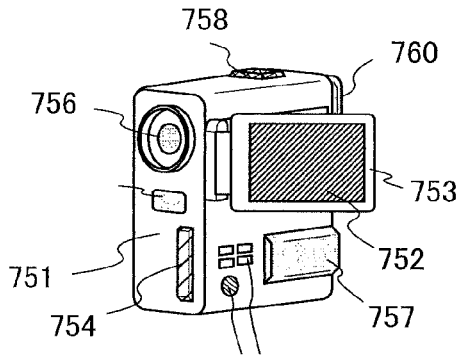

FIG. 13F illustrates a video camera including a main body 751, a display portion 752, a housing 753, an external connection port 754, a remote control receiving portion 755, an image receiving portion 756, a battery 757, an audio input portion 758, operation keys 759, and eye piece 760, and the like. The above-described display device can be applied to the display portion 752.

Figure 13G:
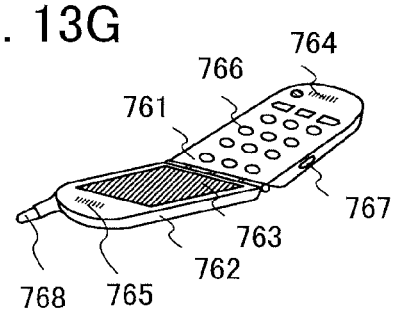

FIG. 13G illustrates a cellular phone including a main body 761, a housing 762, a display portion 763, a sound input portion 764, a sound output portion 765, operation keys 766, an external connection port 767, an antenna 768, and the like. The above-described display device can be applied to the display portion 763. Note that the display portion 763 displays white text on a black screen, so that current consumption of the mobile phone can be suppressed.

In this manner, the above-described display device can be used as the display portion of a variety of electronic devices as above. With the use of a pixel region provided with a circuit designed according to one embodiment of the present invention as the display portion, an electronic device including a UV sensor portion in the display portion can be provided.

This embodiment can be implemented combining with another embodiment as appropriate.

Example

In this example, the result of a shift in a threshold value by irradiating a transistor including an oxide semiconductor film which serves as a UV light receiving element will be described with reference to FIGS. 14A and 14B, FIGS. 15A and 15B, and FIGS. 16A and 16B.

In this example, a transistor including an oxide semiconductor film was formed, and properties of the transistor before and after performing UV irradiation, and during the UV irradiation were measured. Further, properties of the transistor before and after irradiation of visible light was also measured.

A film thickness of an oxide semiconductor film included in the measured transistor was set to 50 nm, a gate insulating film of the transistor was set to 100 nm, a channel length thereof was set to 3 μm, and a channel width thereof was set to 10000 μm. As a light source of the UV rays, "Handy UV Lamp SLUV-6" manufactured by As One Corporation was used, and light with a wavelength of 365 nm or 254 nm was irradiated.

As for the intensity of the UV rays, "UNIMETER UIT-150-A" manufactured by USHIO INC. was used as a UV meter, and UVD-365 was used for a sensor portion. The intensity of the UV rays was measured at a position 5 cm or 20 cm away from the light source. In this example, the intensity of the UV rays was measured at a position 20 cm away from the light source. The UV rays had an intensity of 0.07 mW/cm$^2$ when the wavelength was 365 nm, and an intensity of 0.06 mW/cm$^2$ when the wavelength was 254 nm. The intensity of the UV rays with a wavelength of 254 nm was converted from the result of the wavelength of 365 nm because it was not able to be measured by UNIMETER UIT-150-A.

The properties of the transistor was measured by using a semiconductor parameter analyzer 4156C manufactured by Agilent Technologies Inc. A voltage (VG) applied to a gate was set in the range of −20 V to +20 V, the source-drain voltage (VDS) was set in the range of 3 V to 15 V, and drain current (ID) in each parameter was measured.

Figure 14A:
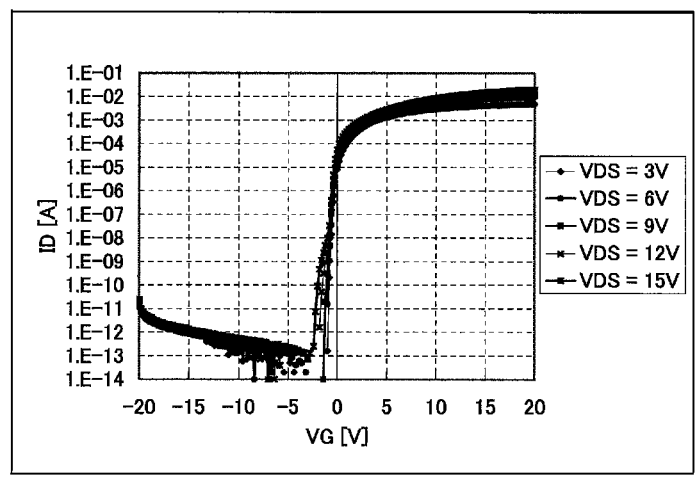
FIGS. 14A and 14B are graphs showing measurement results of electrical conductivity of a transistor that serves as a UV light receiving element.
Figure 14B:
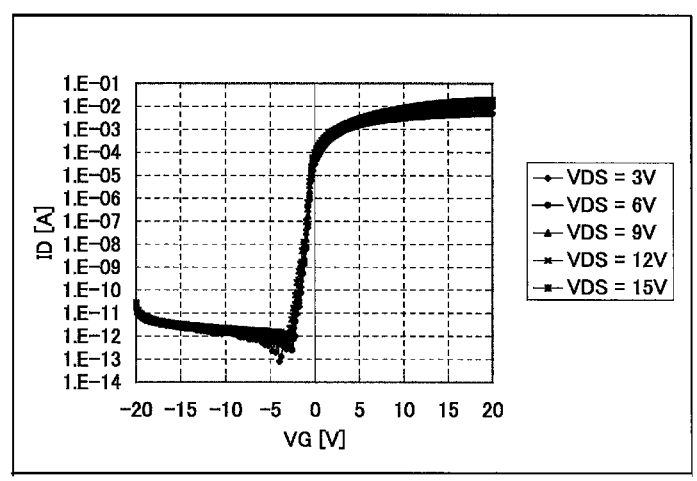

FIG. 14A shows a VG-ID curve of the transistor before performing irradiation of visible light and UV rays. The threshold value was −0.54 V, and the minimum value of off-current was $4.0 \times 10^{-14}$ A or less when VDS=3 V. FIG. 14B shows a VG-ID curve of the transistor during the irradiation of the visible light. The threshold value was −0.75 V, and the minimum value of the off-current was $1.0 \times 10^{-13}$ A or less when VDS=3 V.

The results show that the threshold value is negatively shifted to some degree and the off-current is increased to an extent by the irradiation of visible light. However, by applying to the gate a potential that is lower than the potential at which the threshold value is negatively shifted by the irradiation of visible light in advance, even in the case where a transistor that is a UV light receiving element is formed in the pixel region, a light source such as a backlight does not cause a noise with respect to the UV sensor.

Figure 15A:
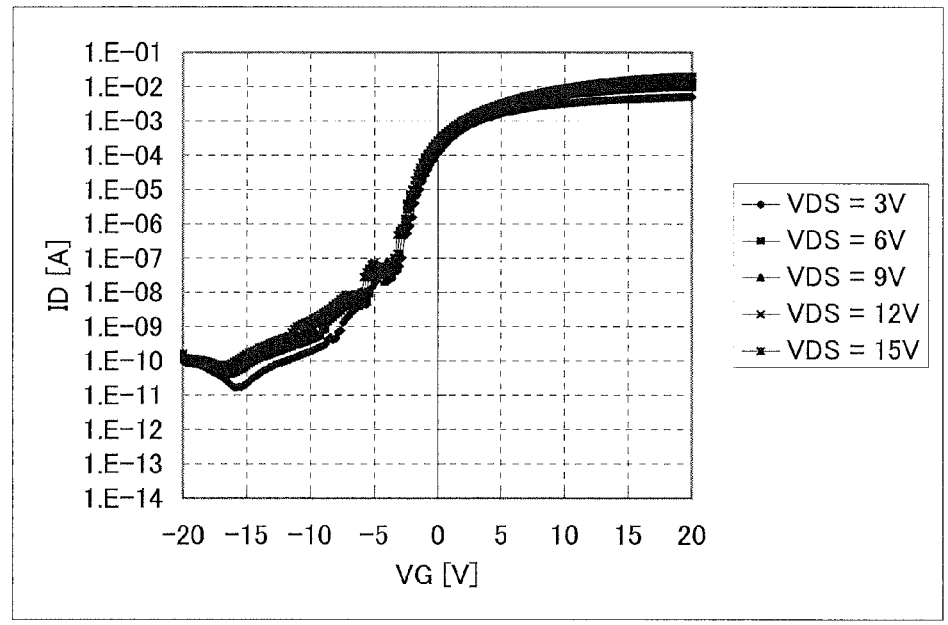
FIGS. 15A and 15B are graphs showing measurement results of electrical conductivity of a transistor that serves as a UV light receiving element.
Figure 15B:
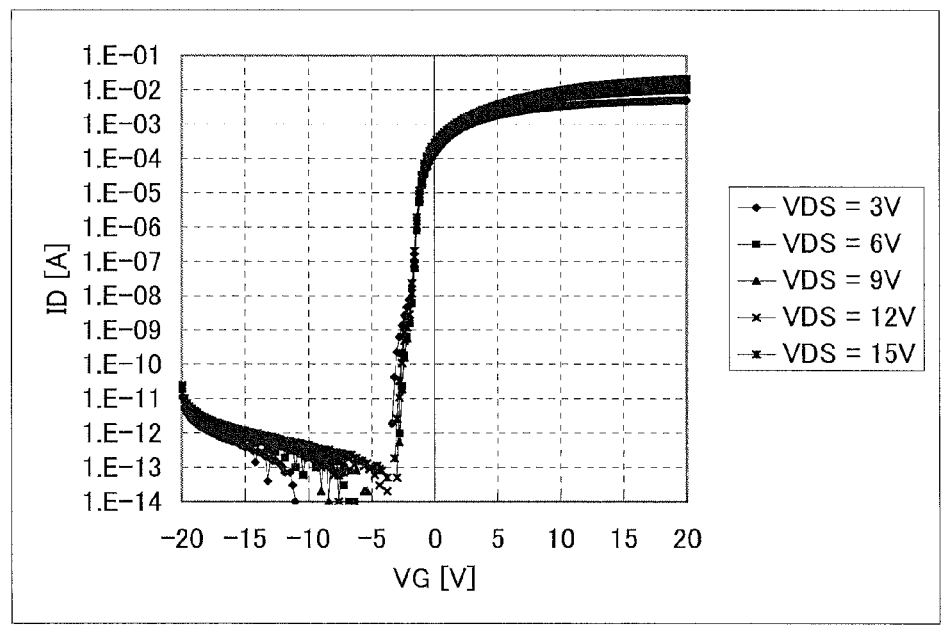

FIG. 15A shows a VG-ID curve of the transistor when the transistor is irradiated with UV rays with a wavelength of 365 nm. The threshold value was −2.0 V, and the minimum value of the off-current was $7.52 \times 10^{-11}$ A when VDS=3 V. FIG. 15B shows a VG-ID curve of the transistor after the transistor is irradiated with UV rays with a wavelength of 365 nm and just after the transistor is shielded from light. The threshold value was −1.44 V, and the minimum value of the off-current was $4.0 \times 10^{-14}$ A or less when VDS=3 V.

From the above result, by setting the voltage applied to the gate of the transistor to −1.8 V or less, UV rays with a wavelength of 365 nm can be detected with high accuracy. Further, by focusing on off-current, off-current of $1.0 \times 10^{-10}$ A or more when VG=−10 V can be the threshold value for detecting UV rays.

In the measurement result in a state where the transistor is shielded from light after being irradiated with UV rays, on-off ratio is improved compared to the measurement result during the UV irradiation. This suggests one possibility that the properties of a transistor turns back after the irradiation of UV rays.

Figure 16A:
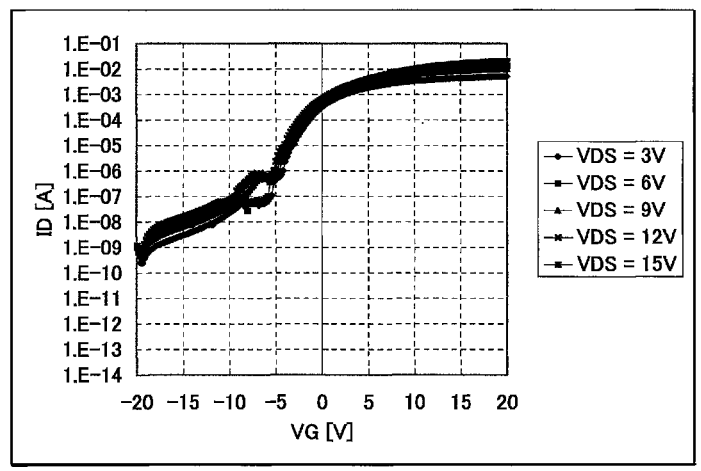
FIGS. 16A and 16B are graphs showing measurement results of electrical conductivity of a transistor that serves as a UV light receiving element.
Figure 16B:
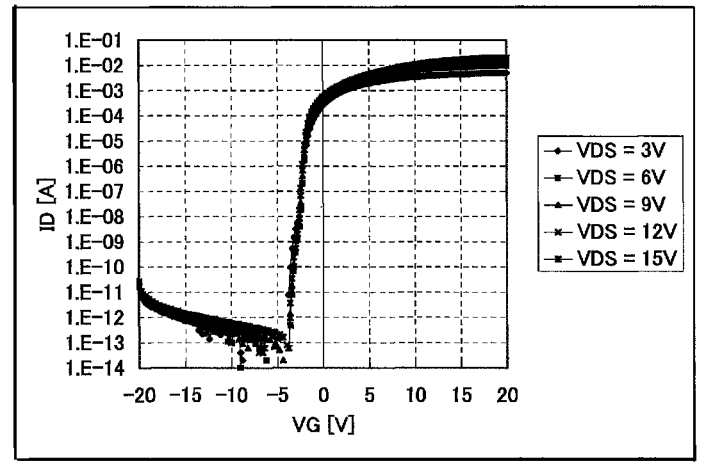

FIG. 16A shows a VG-ID curve of the transistor when the transistor is irradiated with UV rays with a wavelength of 254 nm. The threshold value at this time was −3.23 V, and the minimum value of the off-current was $8.0 \times 10^{-10}$ A when VDS=3 V. FIG. 16B shows a VG-ID curve of the transistor after the transistor is irradiated with UV rays with a wavelength of 254 nm and just after the transistor is shielded from light. The threshold value at this time was −2.16 V, and the minimum value of the off-current was $4.0 \times 10^{-14}$ A or less when VDS=3 V.

From the above result, by setting the voltage applied to the gate of the transistor to −2.5 V or less, UV rays with a wavelength of 254 nm can be detected with high accuracy. Further, by focusing on off-current, off-current of $1.0 \times 10^{-8}$ A or more when VG=−10 V can be the threshold value for detecting UV rays.

In the measurement result in a state where the transistor is irradiated with UV rays and shielded from light, on-off ratio is improved compared to the measurement result during the UV irradiation. This suggests one possibility that the properties of a transistor turns back after the irradiation of UV rays.

Comparing FIGS. 15A and 15B with FIGS. 16A and 16B, as the wavelength of the UV rays becomes shorter, the amount of negative shift and the amount of off-current are remarkably increased. Therefore, by changing the gate potential of the transistor as appropriate and detecting the threshold value or the off-current at the time, the range of wavelengths included in the UV rays can be detected with high accuracy.

This application is based on Japanese Patent Application serial no. 2009-276733 filed with Japan Patent Office on Dec. 4, 2009, the entire contents of which are hereby incorporated by reference.

What is claimed is:

1. A semiconductor device comprising:
   a transistor comprising an oxide semiconductor layer, a gate and a gate insulating film between the oxide semiconductor layer and the gate, the oxide semiconductor layer including channel formation region;
   an operational amplifier comprising a first input terminal, a second input terminal and an output terminal, wherein the first input terminal is electrically connected to one of a source and a drain of the transistor at a first node; and
   a resistive element electrically connected between the first node and a second node.

2. The semiconductor device according to claim 1, wherein the semiconductor device is configured to detect an off-current upon irradiation of a UV ray on the oxide semiconductor layer.

3. The semiconductor device according to claim 1, wherein the second node is connected to a ground.

4. The semiconductor device according to claim 1, wherein the oxide semiconductor layer comprises oxygen, indium, gallium and zinc.

5. The semiconductor device according to claim 1, wherein the oxide semiconductor layer is formed above the gate insulating film.

6. The semiconductor device according to claim 1, wherein the oxide semiconductor layer is formed below the gate insulating film.

7. The semiconductor device according to claim 1, wherein the second input terminal of the operational amplifier is electrically connected to a reference voltage source.

8. A semiconductor device comprising:
   a transistor comprising an oxide semiconductor layer, a gate and a gate insulating film between the oxide semiconductor layer and the gate, the oxide semiconductor layer including channel formation region;
   a variable voltage source electrically connected to the gate of the transistor;

an operational amplifier comprising a first input terminal, a second input terminal and an output terminal, wherein the first input terminal is electrically connected to one of a source and a drain of the transistor at a first node; and a resistive element electrically connected between the first node and a second node.

9. The semiconductor device according to claim 8, wherein the semiconductor device is configured to detect an off-current upon irradiation of a UV ray on the oxide semiconductor layer.

10. The semiconductor device according to claim 8, wherein the second node is connected to a ground.

11. The semiconductor device according to claim 8, wherein the oxide semiconductor layer comprises oxygen, indium, gallium and zinc.

12. The semiconductor device according to claim 8, wherein the oxide semiconductor layer is formed above the gate insulating film.

13. The semiconductor device according to claim 8, wherein the oxide semiconductor layer is formed below the gate insulating film.

14. The semiconductor device according to claim 8, wherein the second input terminal of the operational amplifier is electrically connected to a reference voltage source.

15. A semiconductor device comprising:

a transistor comprising an oxide semiconductor layer, a gate and a gate insulating film between the oxide semiconductor layer and the gate, the oxide semiconductor layer including channel formation region;

an operational amplifier comprising a first input terminal, a second input terminal and an output terminal, wherein the first input terminal is electrically connected to one of a source and a drain of the transistor at a first node;

a resistive element electrically connected between the first node and a second node;

a first voltage source electrically connected to the other of the source and the drain of the transistor; and a second voltage source electrically connected to the second input terminal, wherein the semiconductor device is configured to detect an off-current upon irradiation of a UV ray on the oxide semiconductor layer.

16. The semiconductor device according to claim 15, wherein the oxide semiconductor layer comprises oxygen, indium, gallium and zinc.

17. The semiconductor device according to claim 15, wherein the oxide semiconductor layer is formed above the gate insulating film.

18. The semiconductor device according to claim 15, wherein the oxide semiconductor layer is formed below the gate insulating film.

19. The semiconductor device according to claim 15, wherein the off-current varied dependent upon a wavelength of the UV ray and the semiconductor device is configured to detect a change of the off-current.

20. The semiconductor device according to claim 15, wherein a carrier density of the oxide semiconductor layer is $5.0 \times 10^{14}/cm^3$ or lower.

* * * * *